US012652907B2

(12) United States Patent
Lee et al.

(10) Patent No.: US 12,652,907 B2
(45) Date of Patent: Jun. 9, 2026

(54) DISPLAY APPARATUS HAVING A LIGHT-EMITTING DEVICE

(71) Applicant: LG Display Co., Ltd., Seoul (KR)

(72) Inventors: Ho Seung Lee, Paju-si (KR); Young Wook Lee, Paju-si (KR); Sung Ki Kim, Paju-si (KR); Gi Sang Hong, Paju-si (KR); Jong Won Lee, Paju-si (KR); Jung Min Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 395 days.

(21) Appl. No.: 18/242,385

(22) Filed: Sep. 5, 2023

(65) Prior Publication Data

US 2024/0258464 A1     Aug. 1, 2024

(30) Foreign Application Priority Data

Jan. 31, 2023     (KR) ........................ 10-2023-0012854

(51) Int. Cl.
| | |
|---|---|
| *H10K 59/124* | (2023.01) |
| *H10K 59/122* | (2023.01) |
| *H10K 59/38* | (2023.01) |
| *H10K 59/80* | (2023.01) |

(52) U.S. Cl.
CPC ......... *H10K 59/124* (2023.02); *H10K 59/122* (2023.02); *H10K 59/38* (2023.02); *H10K 59/87* (2023.02)

(58) Field of Classification Search
CPC ............................ H10K 59/124; H10K 59/122
See application file for complete search history.

(56) References Cited

U.S. PATENT DOCUMENTS

| | | |
|---|---|---|
| 2002/0084747 A1 | 7/2002 | Fujieda et al. |
| 2007/0290607 A1 | 12/2007 | Okada et al. |
| 2008/0024402 A1 | 1/2008 | Nishikawa et al. |
| 2014/0027731 A1 | 1/2014 | Kim et al. |

(Continued)

FOREIGN PATENT DOCUMENTS

| | | |
|---|---|---|
| JP | 2002-202737 A | 7/2002 |
| JP | 2004-119197 A | 4/2004 |
| JP | 2015-122248 A | 7/2015 |

(Continued)

*Primary Examiner* — Mariceli Santiago
(74) *Attorney, Agent, or Firm* — Birch, Stewart, Kolasch & Birch, LLP

(57)     ABSTRACT

A display apparatus can include a bank insulating layer disposed on a substrate and defining an emission area in a pixel area; a planarization layer between the substrate and the bank insulating layer and including a planarization protruding portion overlapping with the emission area; an insulating pattern disposed on a side surface of the planarization protruding portion and spaced apart from an upper surface of the planarization protruding portion; and a light-emitting device disposed on the planarization layer in the emission area and having a stacked structure including a first electrode, a light-emitting layer and a second electrode. Also, the side surface of the planarization protruding portion has a concave shape that is depressed toward an inside of the planarization protruding portion, and the insulating pattern is disposed between the first electrode and the light-emitting layer of the light-emitting device.

9 Claims, 14 Drawing Sheets

(56)                     References Cited

U.S. PATENT DOCUMENTS

2015/0179978 A1 *   6/2015   Sato ..................... H10K 50/858
                                                           257/40

FOREIGN PATENT DOCUMENTS

| JP | 2022-519393 | A | | 3/2022 | |
| KR | 100952831 | B1 | * | 4/2010 | .......... H10K 59/878 |
| KR | 10-2014-0014683 | A | | 2/2014 | |
| KR | 10-1911568 | B1 | | 10/2018 | |
| KR | 10-1974082 | B1 | | 4/2019 | |
| KR | 10-2019-0081863 | A | | 7/2019 | |
| KR | 20190081863 | A | * | 7/2019 | ......... H01L 51/5203 |
| KR | 10-2022-0089997 | A | | 6/2022 | |
| WO | WO 2005/107327 | A1 | | 11/2005 | |

* cited by examiner

DISPLAY APPARATUS HAVING A LIGHT-EMITTING DEVICE

CROSS-REFERENCE TO RELATED APPLICATIONS

This application claims priority to Korean Patent Application No. 10-2023-0012854, filed in the Republic of Korea, on Jan. 31, 2023, the entirety of which is hereby incorporated by reference into the present application as if fully set forth herein.

BACKGROUND

Field of the Invention

The present disclosure relates to a display apparatus in which a light-emitting device is disposed in each pixel area.

Discussion of the Related Art

Generally, a display apparatus provides an image to a user. For example, the display apparatus can include a plurality of pixel area. Each of the pixel areas can realize a specific color. For example, a light-emitting device can be disposed in each pixel area. The light-emitting device can emit light displaying a specific color. For example, the light-emitting device can include a light-emitting layer between a first electrode and a second electrode.

In the display apparatus, the light-emitting device of each pixel area can be disposed on a flat surface of a planarization layer. Thus, in the display apparatus, luminance can be rapidly decreased according to an increase in a viewing angle. And, in the display apparatus, light-extraction efficiency can be reduced due to total reflection occurring between the first electrode and the second electrode. Also, when the resolution is increased and more subpixels are used, which this is accompanied by a large increase in power consumption. Thus, there exists a need to be able to provide more subpixels within a smaller amount of space, and to provide subpixels that are brighter, consume less power, and have a wider viewing angle.

SUMMARY OF THE DISCLOSURE

Accordingly, the present disclosure is directed to a display apparatus that substantially obviates one or more problems due to limitations and disadvantages of the related art.

An object of the present disclosure is to provide a display apparatus capable of increasing the light-extraction efficiency.

Another object of the present disclosure is to provide a display apparatus capable of mitigating a decrease in luminance due to an increase in a viewing angle.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus including a device substrate. A bank insulating layer is disposed on the device substrate. The bank insulating layer defines an emission area in a pixel area. A planarization layer is disposed between the device substrate and the bank insulating layer. The planarization layer includes a planarization protruding portion overlapping with the emission area. A side surface of the planarization protruding portion has a concave shape. An insulating pattern is disposed on the side surface of the planarization protruding portion. The insulating pattern is spaced apart from an upper surface of the planarization protruding portion. A light-emitting device is disposed on the planarization layer of the emission area. The light-emitting device includes a first electrode, a light-emitting layer and a second electrode, which are sequentially stacked. The insulating pattern is disposed between the first electrode and the light-emitting layer of the light-emitting device.

A plane shape of the planarization protruding portion can be a polygonal shape.

The insulating pattern can include a same material as the bank insulating layer.

The bank insulating layer can be a linear layer having a uniform thickness. A thickness of the insulating pattern can be smaller than a thickness of the bank insulating layer.

The second electrode can have a reflectivity greater than the first electrode.

A color filter can be disposed between the device substrate and the planarization layer. The color filter can overlap the emission area.

The planarization layer can include a planarization groove surrounding the planarization protruding portion.

A width of the planarization groove can be smaller than a width of the planarization protruding portion.

In another embodiment, there is provided a display device comprising a device substrate. A planarization layer is disposed on the device substrate. The planarization layer includes a planarization groove. A first electrode and a bank insulating layer are disposed on the planarization layer. The first electrode covers a side surface and a bottom surface of the planarization groove. An insulating pattern is disposed on a portion of the first electrode covering the side surface of the planarization groove. The bank insulating layer is disposed outside the planarization groove. The bank insulating layer covers an edge of the first electrode. A light-emitting layer is disposed on a portion of the first electrode exposed by the bank insulating layer. A second electrode is disposed on the light-emitting layer. The second electrode extends onto the bank insulating layer.

The side surface of the planarization groove can be a convex shape.

The insulating pattern can be spaced apart from the bottom surface of the planarization groove.

A plane shape of the planarization groove can be a polygonal shape.

A transmissivity of the second electrode can be greater than a transmissivity of the first electrode.

An encapsulation unit can be disposed on the second electrode. The encapsulation unit can have a stacked structure of an inorganic insulating layer made of an inorganic insulating material and an organic insulating layer made of an organic insulating material.

The planarization layer can include a planarization protruding portion overlapping with the emission area. A width of the planarization protruding portion can be smaller than a width of the planarization groove.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings:

FIGS. 15 to 19 are views sequentially showing a method of forming the display apparatus according to another embodiment of the present disclosure.

DETAILED DESCRIPTION OF THE EMBODIMENTS

Figure 1:
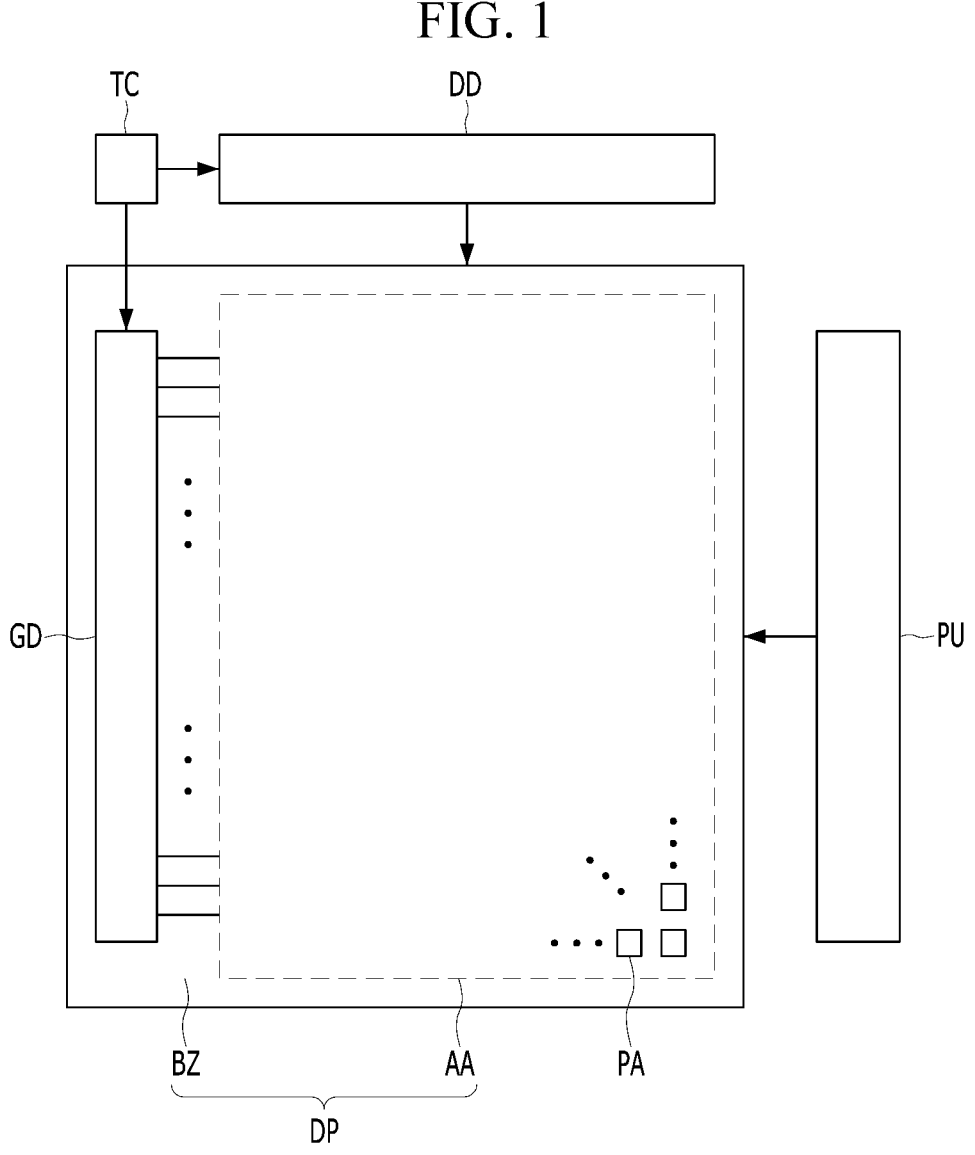
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure can be embodied in other forms and is not limited to the embodiments described below.

In addition, the same or extremely similar elements can be designated by the same reference numerals throughout the specification and in the drawings, the lengths and thickness of layers and regions can be exaggerated for convenience. It will be understood that, when a first element is referred to as being "on" a second element, although the first element can be disposed on the second element to come into contact with the second element, a third element can be interposed between the first element and the second element.

Here, terms such as, for example, "first" and "second" can be used to distinguish any one element with another element. However, the first element and the second element can be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless "directly" is used, the terms "connected" and "coupled" can include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

The features of various embodiments of the present disclosure can be partially or entirely coupled to or combined with each other and can be interlocked and operated in technically various ways, and the embodiments can be carried out independently of or in association with each other.

Figure 2:
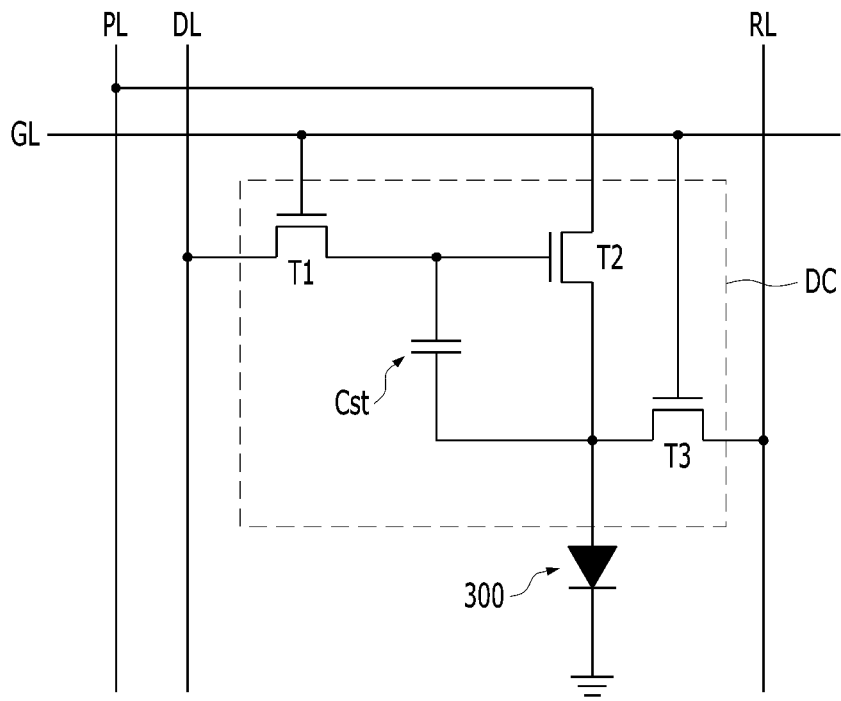
FIG. 2 is a view showing a circuit of a unit pixel area in the display apparatus according to the embodiment of the present disclosure.

FIG. 1 is a view schematically showing a display apparatus according to an embodiment of the present disclosure. FIG. 2 is a view showing a circuit of a unit pixel area in the display apparatus according to the embodiment of the present disclosure.

Referring to FIGS. 1 and 2, the display apparatus according to the embodiment of the present disclosure can include a display panel DP. The display panel DP can generate an image provided to a user. For example, the display panel DP can include a plurality of pixel areas PA.

Various signals can be applied to each pixel area PA through signal wirings GL, DL, PL and RL. For example, the signal wirings GL, DL, PL and RL can include gate lines GL sequentially applying a gate signal to each pixel area PA, data lines DL applying a data signal to each pixel area PA, power voltage supply lines PL supplying a power voltage to each pixel area PA, and reference voltage supply lines RL supplying a reference voltage to each pixel area PA. The gate lines GL can be electrically connected to the gate driver GD. The data lines DL can be electrically connected to the data driver DD. The gate driver GD and the data driver DD can be controlled by a timing controller TC. For example, the gate driver GD can receive clock signals, reset signals and a start signal from the timing controller TC, and the data driver DD can receive digital video data and a source timing signal from the timing controller TC. The power voltage supply lines PL and the reference voltage supply lines RL can be electrically connected to the power unit PU.

The display panel DP can include a display area AA in which the pixel areas PA are disposed, and a bezel area BZ disposed outside the display area AA. At least one of the gate driver GD, the data driver DD, the timing controller TC and the power unit PU can be disposed on the bezel area BZ of the display panel DP. For example, the display apparatus according to the embodiment of the present disclosure can be a Gate In Panel (GIP) type display apparatus in which the gate driver GD is formed on the bezel area BZ of the display panel DP.

Each of the pixel areas PA can realize a specific color. For example, a light-emitting device 300 electrically connected to a pixel driving circuit DC can be disposed in each pixel area PA. The pixel driving circuit DC and the light-emitting device 300 of each pixel area PA can be disposed on a device substrate 100. The device substrate 100 can include an insulating material. The device substrate 100 can include a transparent material. For example, the device substrate 100 can include glass or plastic.

The pixel driving circuit DC of each pixel area PA can supply a driving current corresponding to the data signal to the light-emitting device 300 of the corresponding pixel area PA according to the gate signal. For example, the pixel driving circuit DC of each pixel area PA can include a first thin film transistor T1, a second thin film transistor T2, a third thin film transistor T3 and a storage capacitor Cst.

Figure 3:
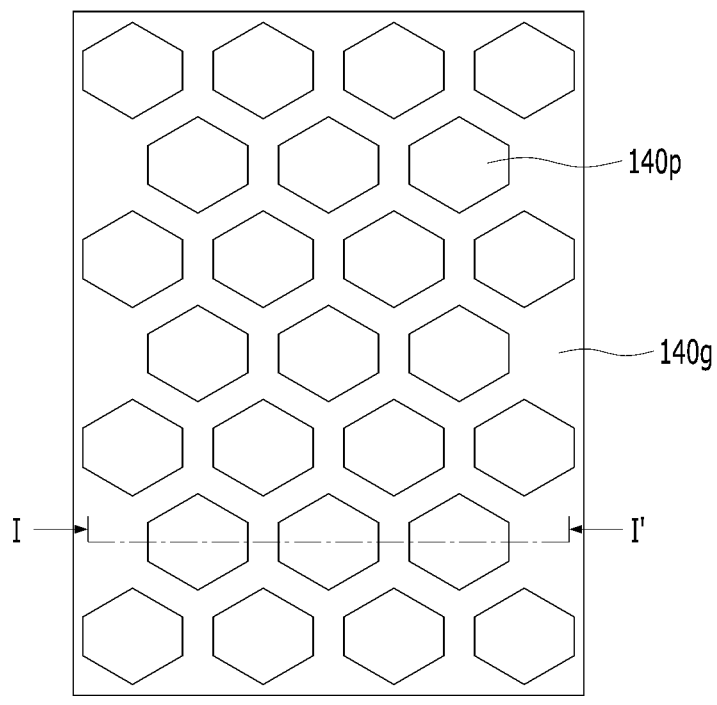
FIG. 3 is a view showing a plane of an emission area in the display apparatus according to the embodiment of the present disclosure.
Figure 4:
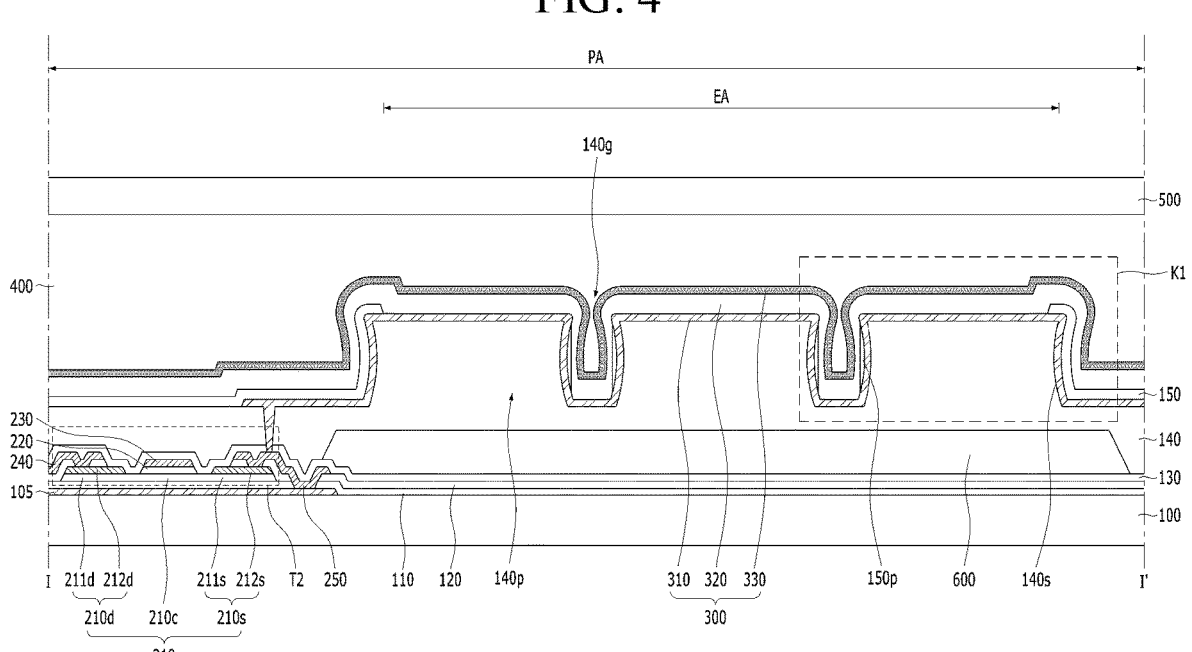
FIG. 4 is a view taken along I-I' of FIG. 3 according to an embodiment of the present disclosure.
Figure 5:
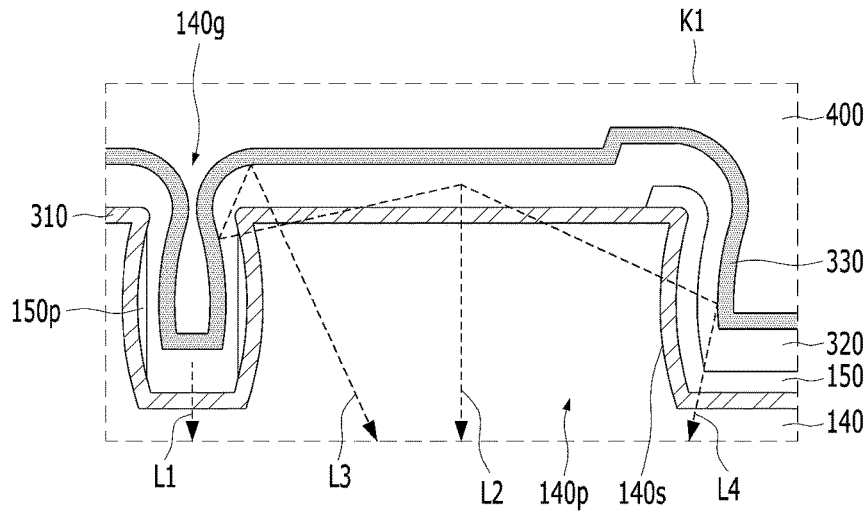
FIG. 5 is an enlarged view of K1 region in FIG. 4 according to an embodiment of the present disclosure.

FIG. 3 is a view showing a plane of an emission area in the display apparatus according to the embodiment of the present disclosure. FIG. 4 is a view taken along I-I' of FIG. 3. FIG. 5 is an enlarged view of K1 region in FIG. 4.

Referring to FIGS. 2 to 5, the first thin film transistor T1 of each pixel area PA can include a first semiconductor pattern, a first gate insulating layer, a first gate electrode, a first drain electrode and a first source electrode. The first thin film transistor T1 of each pixel area PA can transmit the data signal to the second thin film transistor T2 of the corresponding pixel area PA according to the gate signal. For example, the first thin film transistor T1 of each pixel area PA can be a switching thin film transistor. The first gate electrode can be electrically connected to one of the gate lines GL. The first drain electrode can be electrically connected to one of the date lines DL.

The second thin film transistor T2 of each pixel area PA can include a second semiconductor pattern 210, a second gate insulating layer 220, a second gate electrode 230, a second drain electrode 240 and a second source electrode 250. The second thin film transistor T2 of each pixel area PA can generate the driving current corresponding to the data signal. For example, the second thin film transistor T2 of each pixel area PA can be a driving thin film transistor. The second gate electrode 230 can be electrically connected to the first source electrode. The second drain electrode 240 can be electrically connected to one of the power voltage supply lines PL.

The second semiconductor pattern 210 can be disposed on the device substrate 100. The second semiconductor pattern 210 can include a drain region 210d, a channel region 210c and a source region 210s. The channel region 210c can be disposed between the drain region 210d and the source region 210s. The drain region 210d and the source region 210s can have a resistance lower than the channel region 210c. The drain region 210d and the source region 210s can have a multi-layer structure. The source region 210s can have a stacked structure same as the drain region 210d. For example, the drain region 210d can have a stacked structure of a first drain layer 211d and a second drain layer 212d, and the source region 210s can have a stacked structure of a first source layer 211s and a second source layer 212s.

The first drain layer 211d and the first source layer 211s can be disposed on a same layer as the channel region 210c. The channel region 210c, the first drain layer 211d and the first source layer 211s can include a semiconductor material. For example, the channel region 210c, the first drain layer 211d and the first source layer 211s can include an oxide semiconductor, such as IGZO. The first drain layer 211d and the first source layer 211s can include a same material as the channel region 210c. The first drain layer 211d and the first source layer 211s can have a same resistance as the channel region 210c. For example, the channel region 210c, the first drain layer 211d and the first source layer 211s can be a region of an oxide semiconductor which is not conductorized. The first drain layer 211d and the first source layer 211s can be formed simultaneously with the channel region 210c.

The channel region 210c can be in direct contact with the first drain layer 211d and the first source layer 211s. The channel region 210c can physically contact the first drain layer 211d and the first source layer 211s. For example, a boundary surface between the channel region 210c and the first drain layer 211d and a boundary surface between the channel region 210c and the first source layer 211s can be not recognized. Thus, in the display apparatus according to the embodiment of the present disclosure, an internal resistance of the second semiconductor pattern 210 can be minimized.

The second drain layer 212d can be disposed on the first drain layer 211d. For example, the first drain layer 211d can be disposed between the device substrate 100 and the second drain layer 212d. The second drain layer 212d can be in direct contact with the first drain layer 211d. For example, a lower surface of the second drain layer 212d toward the device substrate 100 can be in direct contact with an upper surface of the first drain layer 211d opposite to the device substrate 100. The second source layer 212s can be disposed on the first source layer 211s. For example, the first source layer 211s can be disposed between the device substrate 100 and the second source layer 212s. The second source layer 212s can be in direct contact with the first source layer 211s. For example, a lower surface of the second source layer 212s toward the device substrate 100 can be in direct contact with an upper surface of the first source layer 211s opposite to the device substrate 100. Thus, in the display apparatus according to the embodiment of the present disclosure, a resistance of the drain region 210d and a resistance of the source region 210s can be minimized.

The second drain layer 212d and the second source layer 212s can include a material different from the channel region 210c, the first drain layer 211d and the first source layer 211s. The second drain layer 212d and the second source layer 212s can have a resistance lower than the channel region 210c, the first drain layer 211d and the first source layer 211s. For example, the second drain layer 212d and the second source layer 212s can include a metal or a conductive metal oxide, such as ITO and IZO. Thus, in the display apparatus according to the embodiment of the present disclosure, a resistance of the drain region 210d and a resistance of the source region 210s can be minimized. The second source layer 212s can include a same material as the second drain layer 212d. For example, the second source layer 212s can be formed simultaneously with the second drain layer 212d. The second drain layer 212d and the second source layer 212s can be disposed outside the channel region 210c. For example, a step of forming the second semiconductor pattern 210 can include a step of forming a semiconductor material layer on the device substrate 100, a step of forming a low resistance material layer on the semiconductor material layer, a step of patterning the semiconductor material layer and the low resistance material layer, and a step of removing a portion of the low resistance material layer overlapping with the channel region 210c. Therefore, in the display apparatus according to the embodiment of the present disclosure, a process efficiency of forming the second semiconductor pattern 210 can be improved.

The first semiconductor pattern can have a same structure as the second semiconductor pattern 210. For example, the first semiconductor pattern can include a channel region between a drain region and a source region, the drain region and the source region can have a stacked structure of a first layer including a same material as the channel region and a second layer having a resistance lower than the first layer, respectively. The first semiconductor pattern can be formed simultaneously with the second semiconductor pattern 210. For example, the channel region 210*c* of the second semiconductor pattern 210 can have a same resistance as the channel region of the first semiconductor pattern. Thus, in the display apparatus according to the embodiment of the present disclosure, process efficiency can be effectively improved.

The second gate insulating layer 220 can be disposed on the channel region 210*c* of the second semiconductor pattern 210. The drain region 210*d* and the source region 210*s* of the second semiconductor pattern 210 can be disposed outside the second gate insulating layer 220. For example, the second gate insulating layer 220 can be disposed between the second drain layer 212*d* and the second source layer 212*s*. The second gate insulating layer 220 can include an insulating material. For example, the second gate insulating layer 220 can be an inorganic insulating layer made of an inorganic insulating material, such as silicon oxide (SiOx) and silicon nitride (SiNx).

The first gate insulating layer can include a same material as the second gate insulating layer 220. For example, the second gate insulating layer 220 can be formed simultaneously with the first gate insulating layer. A thickness of the first gate insulating layer can be the same as a thickness of the second gate insulating layer 220.

The second gate electrode 230 can be disposed on the second gate insulating layer 220. For example, the second gate electrode 230 can overlap the channel region 210*c* of the second semiconductor pattern 210. The second gate electrode 230 can be insulated from the second semiconductor pattern 210 by the second gate insulating layer 220. For example, a side of the second gate electrode 230 can be continuously with a side of the second gate insulating layer 220. The second gate electrode 230 can include a conductive material. For example, the second gate electrode 230 can include a metal, such as aluminum (Al), chrome (Cr), copper (Cu), molybdenum (Mo), titanium (Ti) and tungsten (W). The channel region 210*c* of the second semiconductor pattern 210 can have an electrical conductivity corresponding to a voltage applied to the second gate electrode 230.

The first gate electrode can include a same material as the second gate electrode 230. For example, the second gate electrode 230 can be formed simultaneously with the first gate electrode. A side of the first gate electrode can be continuously with a side of the first gate insulating layer. For example, the source region of the first semiconductor pattern can be electrically connected to the drain region of the first semiconductor pattern by a voltage applied to the first gate electrode.

The second drain electrode 240 can include a conductive material. For example, the second drain electrode 240 can include a metal, such as aluminum (Al), chrome (Cr), copper (Cu), molybdenum (Mo), titanium (Ti) and tungsten (W). The second drain electrode 240 can include a same material as the second gate electrode 230. For example, the second drain electrode 240 can be formed simultaneously with the second gate electrode 230. The second drain electrode 240 can be disposed on a same layer as the second gate electrode 230. The second drain electrode 240 can be spaced apart from the second gate electrode 230. The second drain electrode 240 can be insulated from the second gate electrode 230. The second drain electrode 240 can be electrically connected to the drain region 210*d* of the second semiconductor pattern 210. For example, the second drain electrode 240 can be in direct contact with the second drain layer 212*d* of the second semiconductor pattern 210.

The second source electrode 250 can include a conductive material. For example, the second source electrode 250 can include a metal, such as aluminum (Al), chrome (Cr), copper (Cu), molybdenum (Mo), titanium (Ti) and tungsten (W). The second source electrode 250 can include a same material as the second drain electrode 240. For example, the second source electrode 250 can be formed simultaneously with the second drain electrode 240. The second source electrode 250 can be disposed on a same layer as the second drain electrode 240. The second source electrode 250 can be spaced apart from the second gate electrode 230 and the second drain electrode 240. The second source electrode 250 can be insulated from the second gate electrode 230. The second source electrode 250 can be electrically connected to the source region 210*s* of the second semiconductor pattern 210. For example, the second source electrode 250 can be in direct contact with the second source layer 212*s* of the second semiconductor pattern 210.

The first drain electrode and the first source electrode can include a same material as the second drain electrode 240 and the second source electrode 250. The first drain electrode and the first source electrode can be disposed on a same layer as the second drain electrode 240 and the second source electrode 250. For example, the second drain electrode 240 and the second source electrode 250 can be formed simultaneously with the first drain electrode and the first source electrode. The first drain electrode and the first source electrode can include a same material as the first gate electrode.

The third thin film transistor T3 of each pixel area PA can include a third semiconductor pattern, a third gate insulating layer, a third gate electrode, a third source electrode and a third drain electrode. The third thin film transistor T3 of each pixel area PA can reset the storage capacitor Cst of the corresponding pixel area PA according to the gate signal. For example, the third thin film transistor T3 of each pixel area PA can be disposed between the storage capacitor Cst of the corresponding pixel area PA and one of the reference voltage supply lines RL. The reference voltage can be supplied to the storage capacitor Cst of each pixel area PA according to the gate signal. For example, the third thin film transistor T3 of each pixel area PA can be a switching thin film transistor. The third gate electrode can be electrically connected to one of the gate lines GL. The third drain electrode can be electrically connected to one of the reference voltage supply lines RL. The first gate electrode and the third gate electrode of each pixel area PA can be electrically connected to a same gate line GL. For example, the third thin film transistor T3 of each pixel area PA can turn-on/off simultaneously with the first thin film transistor T1 of the corresponding pixel area PA.

The third thin film transistor T3 of each pixel area PA can be formed simultaneously with the first thin film transistor T1 of the corresponding pixel area PA. For example, the third semiconductor pattern can be formed in a same structure as the first semiconductor pattern. The third gate insulating layer can include a same material as the first gate insulating layer. The third gate electrode, the third drain electrode and the third source electrode can include a same material as the first gate electrode, the first drain electrode and the first source electrode. Thus, in the display apparatus according to the embodiment of the present disclosure, process efficiency can be improved.

The storage capacitor Cst of each pixel area PA can maintain a signal applied to the second gate electrode 230 of the second thin film transistor T2 in the corresponding pixel area PA for one frame. For example, the storage capacitor Cst of each pixel area PA can be electrically connected between the second gate electrode 230 and the second source electrode 250 of the second thin film transistor T2 in the corresponding pixel area PA. The storage capacitor Cst of each pixel area PA can have a stacked structure of capacitor electrodes. For example, the storage capacitor Cst of each pixel area PA can include a first capacitor electrode electrically connected to the second gate electrode 230 of the corresponding pixel area PA and a second capacitor electrode electrically connected to the second source electrode 250 of the corresponding pixel area PA. The third source electrode of the third thin film transistor T3 in each pixel area PA can be connected to the same capacitor electrode as the second source electrode 250 of the corresponding pixel area PA. For example, the third source electrode of the third thin film transistor T3 in each pixel area PA can be electrically connected to the second capacitor electrode of the storage capacitor Cst in the corresponding pixel area PA.

A plurality of insulating layers 110, 120, 130, 140 and 150 for preventing unnecessary electrical connection in each pixel area PA can be disposed on the device substrate 100. For example, a device buffer layer 110, an interlayer insulating layer 120, a device passivation layer 130, a planarization layer 140 and a bank insulating layer 150 can be disposed on the device substrate 100.

The device buffer layer 110 can be disposed close to the device substrate 100. The device buffer layer 110 can prevent pollution due to the device substrate 100 in a process of forming the pixel driving circuit DC of each pixel area PA. For example, an upper surface of the device substrate 100 toward the pixel driving circuit DC of each pixel area PA can be completely covered by the device buffer layer 110. The pixel driving circuit DC of each pixel area PA can be disposed on the device buffer layer 110. The device buffer layer 110 can include an insulating material. For example, the device buffer layer 110 can include an inorganic insulating material, such as silicon oxide (SiOx) and silicon nitride (SiNx). The device buffer layer 110 can include a multi-layer structure. For example, the device buffer layer 110 can have a stacked structure of an inorganic insulating layer made of silicon oxide (SiOx) and an inorganic insulating layer made of silicon nitride (SiNx).

A light-blocking pattern 105 can be disposed between the device substrate 100 and the pixel driving circuit DC of each pixel area PA. For example, the light-blocking pattern 105 of each pixel area PA can be disposed between the device substrate 100 and the device buffer layer 110. The second semiconductor patterns 210 of each pixel area PA can overlap the light-blocking pattern 105 of the corresponding pixel area PA. The light-blocking pattern 105 can include a material capable of blocking light (e.g., to prevent light from reflecting off of the transistor, etc.). For example, the light-blocking pattern 105 can include a metal. Thus, in the display apparatus according to the embodiment of the present disclosure, external light travelling in a direction of the second semiconductor pattern 210 of each thin film transistor T1, T2 and T3 though the device substrate 100 can be blocked by the light-blocking pattern 105. Therefore, in the display apparatus according to the embodiment of the present disclosure, changes in the characteristics of each thin film transistors T1, T2 and T3 due to the external light can be prevented.

The light-blocking pattern 105 can include a conductive pattern. A specific voltage can be applied to the light-blocking pattern 105. For example, the light-blocking pattern 105 of each pixel area PA can be electrically connected to the second source electrode 250 of the corresponding pixel area PA. Thus, in the display apparatus according to the embodiment of the present disclosure, the external light travelling in a direction of the second semiconductor pattern 210 of each thin film transistor T1, T2 and T3 can be effectively blocked.

The interlayer insulating layer 120 can be disposed on the device buffer layer 110. The interlayer insulating layer 120 can include an insulating material. For example, the interlayer insulating layer 120 can be an inorganic insulating layer made of an inorganic insulating material, such as silicon oxide (SiOx) and silicon nitride (SiNx). The interlayer insulating layer 120 can include a same material as the second gate insulating layers 220 of each pixel area PA. The second gate insulating layers 220 of each pixel area PA can be disposed on a same layer as the interlayer insulating layer 120. For example, the second drain electrode 240 and the second source electrode 250 of each pixel area PA can include a region disposed on the interlayer insulating layer 120. The second source electrode 250 of each pixel area PA can be in direct contact with the light-blocking pattern 105 of the corresponding pixel area PA by penetrating the device buffer layer 110 and the interlayer insulating layer 120.

The device passivation layer 130 can be disposed on the interlayer insulating layer 120. The device passivation layer 130 can prevent damage of the pixel driving circuit DC in each pixel area PA due to external moisture and impact. For example, the first drain electrode, the first source electrode, the second drain electrode 240, the second source electrode 250, the third drain electrode and the third source electrode of each pixel area PA can be covered by the device passivation layer 130. The device passivation layer 130 can include an insulating material. For example, the device passivation layer 130 can be an inorganic insulating layer made of an inorganic insulating material, such as silicon oxide (SiOx) and silicon nitride (SiNx).

The planarization layer 140 can be disposed on the device passivation layer 130. The planarization layer 140 can include an insulating material. The planarization layer 140 can include a material different from the device passivation layer 130. For example, the planarization layer 140 can be an organic insulating layer made of an organic insulating material. A thickness difference due to the pixel driving circuit DC of each pixel area PA can be removed by the planarization layer 140.

The planarization layer 140 of each pixel area PA can include a plurality of planarization protruding portions 140p (e.g., raised mesa shaped portions). Each of the planarization protruding portions 140p can be spaced apart from an adjacent planarization protruding portion 140p. The plurality of the planarization protruding portions 140p can be disposed side by side in the corresponding pixel area PA. Each of the planarization protruding portions 140p can be staggered with an adjacent planarization protruding portion 140p. For example, a plane shape of each planarization protruding portion 140p can be a hexagonal shape, but embodiments are not limited thereto. For example, a plane shape of each planarization protruding portion 140p can be a polygonal shape, a square shape, a rounded shape, an oval shape, a circular shape, a triangular shape or a rectangular shape, etc. The planarization layer 140 of each pixel area PA can include a planarization groove 140g disposed outside the planarization protruding portions 140p. The planarization groove 140g can extend between the planarization protruding portions 140p. For example, a side surface 140s of each planarization protruding portion 140p can be a side surface of the planarization groove 140g. The side surface 140s of each planarization protruding portion 140p can have a concave shape toward inside of the corresponding planarization protruding portion 140p. The planarization groove 140g can have a side surface 140s convex outward from the planarization groove 140g. A width of the planarization groove 140g between adjacent planarization protruding portions 140p can be smaller than a width of each planarization protruding portion 140p.

The bank insulating layer 150 can be disposed on the planarization layer 140. The bank insulating layer 150 can define an emission area EA in each pixel area PA. the planarization protruding portions 140p on each pixel area PA can be disposed in the emission area EA defined in the corresponding pixel area PA by the bank insulating layer 150. For example, the planarization protruding portions 140p and the planarization groove 140g of each pixel area PA can be disposed in the emission area EA of the corresponding pixel area PA. The bank insulating layer 150 can include an insulating material. For example, the bank insulating layer 150 can be an inorganic insulating layer including an inorganic insulating material, such as silicon oxide (SiOx) and silicon nitride (SiNx). The bank insulating layer 150 can be a linear layer having a uniform thickness. For example, The bank insulating layer 150 can extend along the side surface 140s of the planarization protruding portion 140p disposed close to an edge of the emission area EA defined in each pixel area PA.

The light-emitting device 300 of each pixel area PA can be disposed on the planarization layer 140 of the emission area EA defined in the corresponding pixel area PA. The light-emitting device 300 of each pixel area PA can emit light displaying a specific color. For example, the light-emitting device 300 of each pixel area PA can include a first electrode 310, a light-emitting layer 320 and a second electrode 330, which are sequentially stacked on the planarization layer 140 of the emission area EA defined in the corresponding pixel area PA.

The first electrode 310 can include a conductive material. The first electrode 310 can have a relatively high transmissivity. For example, the first electrode 310 can be a transparent electrode made of a transparent conductive material, such as ITO and IZO.

The light-emitting layer 320 can generate light having luminance corresponding to a voltage difference between the first electrode 310 and the second electrode 330. For example, the light-emitting layer 320 can include an emission material layer (EML) having an emission material. The emission material can include an organic material, an inorganic material or a hybrid material. For example, the display apparatus according to the embodiment of the present disclosure can be an organic light-emitting display apparatus including an organic emission material.

The light-emitting layer 320 can have a multi-layer structure. For example, the light-emitting layer 320 can further include at least one of a hole injection layer (HIL), a hole transport layer (HTL), an electron transport layer (ETL) and an electron injection layer (EIL). Thus, in the display apparatus according to the embodiment of the present disclosure, the emission efficiency can be improved.

The second electrode 330 can include a conductive material. The second electrode 330 can include a material different from the first electrode 310. A reflectivity of the second electrode 330 can be higher than a reflectivity of the first electrode 310. For example, the second electrode 330 can include a metal, such as aluminum (Al) and silver (Ag). Thus, in the display apparatus according to the embodiment of the present disclosure, the light generated by the light-emitting layer 320 can be emitted outside through the first electrode 310 (e.g., in a downward direction through substrate 100).

The pixel driving circuit DC of each pixel area PA can be disposed outside the emission area EA of the corresponding pixel area PA. For example, the first thin film transistor T1, the second thin film transistor T2, the third thin film transistor T3 and the storage capacitor Cst of each pixel area PA does not overlap with the emission area EA of the corresponding pixel area PA (e.g., the pixel driving circuit DC spaced apart to the side of the corresponding emission area EA). Thus, in the display apparatus according to the embodiment of the present disclosure, the light emitted from the light-emitting device 300 of each pixel area PA is not blocked by the pixel driving circuit DC of the corresponding pixel area PA. Therefore, in the display apparatus according to the embodiment of the present disclosure, a decrease in light-extraction efficiency due to the pixel driving circuit DC of each pixel area PA can be prevented because there are fewer elements and layers for the light to pass through.

The light-emitting device 300 of each pixel area PA can be electrically connected to the second thin film transistor T2 of the pixel driving circuit DC in the corresponding pixel area PA. For example, the second source electrode 250 of each pixel area PA can be electrically connected to the first electrode 310 of the corresponding pixel area PA. The device passivation layer 130 and the planarization layer 140 can include electrode contact holes partially exposing the second source electrode 250 of each pixel area PA. For example, the first electrode 310 of each pixel area PA can be in direct contact with the second source electrode 250 of the corresponding pixel area PA. The electrode contact holes can be disposed outside the emission area EA defined in each pixel area PA. For example, the electrode contact holes can overlap with the bank insulating layer 150. An edge of the first electrode 310 in each pixel area PA can be covered by the bank insulating layer 150. For example, the bank insulating layer 150 can extend along a side of the first electrode 310 and onto a portion of an uppermost surface of the first electrode 310. The light-emitting layer 320 and the second electrode 330 of each pixel area PA can be sequentially stacked on a portion of the corresponding first electrode 310 exposed by the bank insulating layer 150. The first electrode 310 of each pixel area PA can be insulated from the first electrode 310 of adjacent pixel area PA by the bank insulating layer 150.

The first electrode 310, the light-emitting layer 320 and the second electrode 330 of each pixel area PA can be sequentially stacked on an upper surface of each planarization protruding portion 140p and a bottom surface of the planarization groove 140g in the corresponding pixel area PA. For example, in the display apparatus according to the embodiment of the present disclosure, the light emitted from each pixel area PA can include light L1 generated by a portion of the light-emitting layer 320 on the bottom surface of the planarization groove 140g in the corresponding pixel area PA and light L2 generated by a portion of the light-emitting layer 320 on the upper surface of each planarization protruding portion 140p in the corresponding pixel area PA. The first electrode 310, the light-emitting layer 320 and the second electrode 330 of each pixel area PA can extend onto the side surface 140s of each planarization protruding portion 140p in the corresponding pixel area PA. For example, the side surface 140s of each planarization protruding portion 140p in each pixel area PA can be in direct contact with the first electrode 310 of the corresponding pixel area PA. That is, in the display apparatus according to the embodiment of the present disclosure, a curve formed by the planarization protruding portions 140p of each pixel area PA can be covered by the second electrode 330 of the corresponding pixel area PA. Thus, in the display apparatus according to the embodiment of the present disclosure, a light totally reflected between the first electrode 310 and the second electrode 330 of each pixel area PA can be emitted outside by the second electrode 330 covering the side surface 140s of each planarization protruding portion 140p in the corresponding pixel area PA. And, in the display apparatus according to the embodiment of the present disclosure, light L3 and L4 emitted in a lateral direction from a portion of the light-emitting layer 320 disposed on the upper surface of each planarization protruding portion 140p in each pixel area PA can be reflected toward the device substrate 100 by the second electrode 330 of the corresponding pixel area PA. Therefore, in the display apparatus according to the embodiment of the present disclosure, light-extraction efficiency can be improved. In other words, the light emitting portion of each pixel area PA can fill gaps in the grooves to create a series of folds or fin type protrusions extending toward the substrate, in order to provide an increase in the total surface area of the light emitting portion while still maintaining a small footprint which allows the device to output more light with smaller pixels allowing for improved luminance and higher resolutions, and also improving the viewing angle since more light is output at various output angles.

In the display apparatus according to the embodiment of the present disclosure, the light L3 and L4 emitted in a lateral direction from the portion of the light-emitting layer 320 disposed on the upper surface of each planarization protruding portion 140p in each pixel area PA can be reflected in various directions. For example, in the display apparatus according to the embodiment of the present disclosure, light reflected by a portion of the second electrode 330 disposed close to the upper surface of each planarization protruding portion 140p can be re-reflected toward the device substrate 100 by a portion of the second electrode 330 disposed on the upper surface of the corresponding planarization protruding portion 140p. And, in the display apparatus according to the embodiment of the present disclosure, light L4 emitted toward a portion of the second electrode 330 disposed far from the upper surface of each planarization protruding portion 140p can reflected toward the device substrate 100 by the corresponding portion of the second electrode 330. Thus, in the display apparatus according to the embodiment of the present disclosure, the light generated by each light-emitting device 300 can be emitted in various directions by the second electrode 330 covering each planarization protruding portion 140p. Therefore, in the display apparatus according to the embodiment of the present disclosure, a decrease in luminance due to an increase in a viewing angle can be mitigated or prevented.

An insulating pattern 150p can be disposed in the emission area EA of each pixel area PA. The insulating pattern 150p can be disposed on the side surface 140s of each planarization protruding portion 140p. For example, the insulating pattern 150p can be disposed between a portion of the first electrode 310 and a portion of the light-emitting layer 320, which are stacked on the side surface 140s of each planarization protruding portion 140p. Thus, in the display apparatus according to the embodiment of the present disclosure, the portion of the light-emitting layer 320 on the side surface 140s of each planarization protruding portion 140p can be spaced apart from the portion of the corresponding first electrode 310 by the insulating pattern 150p. The insulating pattern 150p can include an insulating material. For example, the insulating pattern 150p can be an inorganic insulating layer made of an inorganic insulating material, such as silicon oxide (SiOx) and silicon nitride (SiNx). The insulating pattern 150p can include a same material as the bank insulating layer 150. Therefore, in the display apparatus according to the embodiment of the present disclosure, light may not be emitted from the portion of the light-emitting layer 320 on the side surface 140s of each planarization protruding portion 140p. In other words, in which way, energy is not wasted or used to emit light in a direction perpendicular to the viewer since the current is blocked at strategic locations by the insulating pattern 150p, and more energy can be used in the areas that emit light in a direction that better corresponds to a direction in which the viewer is facing.

In general, the light-emitting layer 320 of each pixel area PA can be formed by a deposition process having poor step coverage. For example, in the display apparatus according to the embodiment of the present disclosure, the portion of the light-emitting layer 320 disposed on the side surface 140s of each planarization protruding portion 140p can be formed with a relatively small thickness. The light-emitting layer 320 can have a resistance proportional to the thickness. Thus, in the display apparatus according to the embodiment of the present disclosure, the portion of the light-emitting layer 320 formed on the side surface 140s of each planarization protruding portion 140p can have a relatively small resistance. An electric field can be concentrated in the portion of the light-emitting layer 320 having a relatively small resistance. That is, when the portion of the light-emitting layer 320 having a relatively small resistance emits light, other portions of the light-emitting layer 320 having a relatively large resistance may not emit light. Therefore, in the display apparatus according to the embodiment of the present disclosure, the portion of the light-emitting layer 320 formed with a relatively small thickness on the side surface 140s of each planarization protruding portion 140p may not emit light, and a decrease in an emission area due to the difference in resistance of the light-emitting layer 320 can be prevented.

The light emitted from the light-emitting device 300 of each pixel area PA can display a same color as the light emitted from the light-emitting device 300 of adjacent pixel area PA. For example, the light-emitting device 300 of each pixel area PA can emit white light. The light-emitting layer 320 of each pixel area PA can include a same material as the light-emitting layer 320 of adjacent pixel area PA. The light-emitting layer 320 of each pixel area PA can have a same structure as the light-emitting layer 320 of adjacent pixel area PA. For example, the light-emitting layer 320 of each pixel area PA can be simultaneously formed with the light-emitting layer 320 of adjacent pixel area PA. The light-emitting layer 320 of each pixel area PA can be in direct contact with the light-emitting layer 320 of adjacent pixel area PA. For example, the light-emitting layer 320 of each pixel area PA can extend onto the bank insulating layer 150.

Also, each of the pixel areas PA can realize a color different from an adjacent pixel area PA. For example, a color filter 600 can be disposed between the device substrate 100 and the first electrode 310 of each pixel area PA. The color filter 600 of each pixel area PA can be disposed in a path of the light emitted from the light-emitting device 300 of the corresponding pixel area PA. For example, the color filter 600 of each pixel area PA can overlap with the emission area EA of the corresponding pixel area PA. The color filter 600 of each pixel area PA can be disposed between the device passivation layer 130 and the planarization layer 140. A thickness difference due to the color filter 600 of each pixel area PA can be removed by the planarization layer 140. The color filter 600 of each pixel area PA can have an area larger than the emission area EA of the corresponding pixel area PA. Thus, in the display apparatus according to the embodiment of the present disclosure, light leakage due to the light that does not pass through the color filter 600 of each pixel area PA can be prevented.

A voltage applied to the second electrode 330 of each pixel area PA can be a same as a voltage applied to the second electrode 330 of adjacent pixel area PA. For example, the second electrode 330 of each pixel area PA can be electrically connected to the second electrode 330 of adjacent pixel area PA. The second electrode 330 of each pixel area PA can be formed simultaneously with the second electrode 330 of adjacent pixel area PA. For example, the second electrode 330 of each pixel area PA can include a same material as the second electrode 330 of adjacent pixel area PA. The second electrode 330 of each pixel area PA can be in direct contact with the second electrode 330 of adjacent pixel area PA. Thus, in the display apparatus according to the embodiment of the present disclosure, a process of forming the second electrode 330 in each pixel area PA can be simplified. And, in the display apparatus according to the embodiment of the present disclosure, the luminance of the light emitted from the light-emitting device 300 of each pixel area PA can be adjusted by the data signal applied to the pixel driving circuit DC of the corresponding pixel area PA.

An encapsulating unit 400 can be disposed on the light-emitting device 300 of each pixel area PA. The encapsulating unit 400 can prevent damage of the light-emitting devices 300 due to the external moisture and impact. For example, the light-emitting device 300 of each pixel area PA can be completely covered by the encapsulating unit 400. The planarization groove 140g of each pixel area PA can be filled by the encapsulating unit 400. The encapsulating unit 400 can include an insulating material. For example, the encapsulating unit 400 can include an olefin-based material. The encapsulating unit 400 can include a moisture-absorbing material.

An encapsulation substrate 500 can be disposed on the encapsulating unit 400. The encapsulation substrate 500 can be coupled to the device substrate 100 in which the light-emitting devices 300 are formed by the encapsulating unit 400. For example, the encapsulating unit 400 can include an adhesive material. The encapsulation substrate 500 can prevent the damages of the light-emitting devices 300 due to the external moisture and impact. The encapsulation substrate 500 can include a material having a relatively high thermal conductivity. For example, the encapsulation substrate 500 can include a metal, such as aluminum (Al), iron (Fe) and nickel (Ni). Thus, in the display apparatus according to the embodiment of the present disclosure, heat generated by the pixel driving circuit DC and the light-emitting device 300 of each pixel area PA can be emitted through the encapsulation substrate 500. Therefore, in the display apparatus according to the embodiment of the present disclosure, deterioration of each light-emitting device 300 due to heat can be prevented.

FIGS. 6 to 11 are views sequentially showing a method of forming the display apparatus according to the embodiment of the present disclosure.

Figure 6:
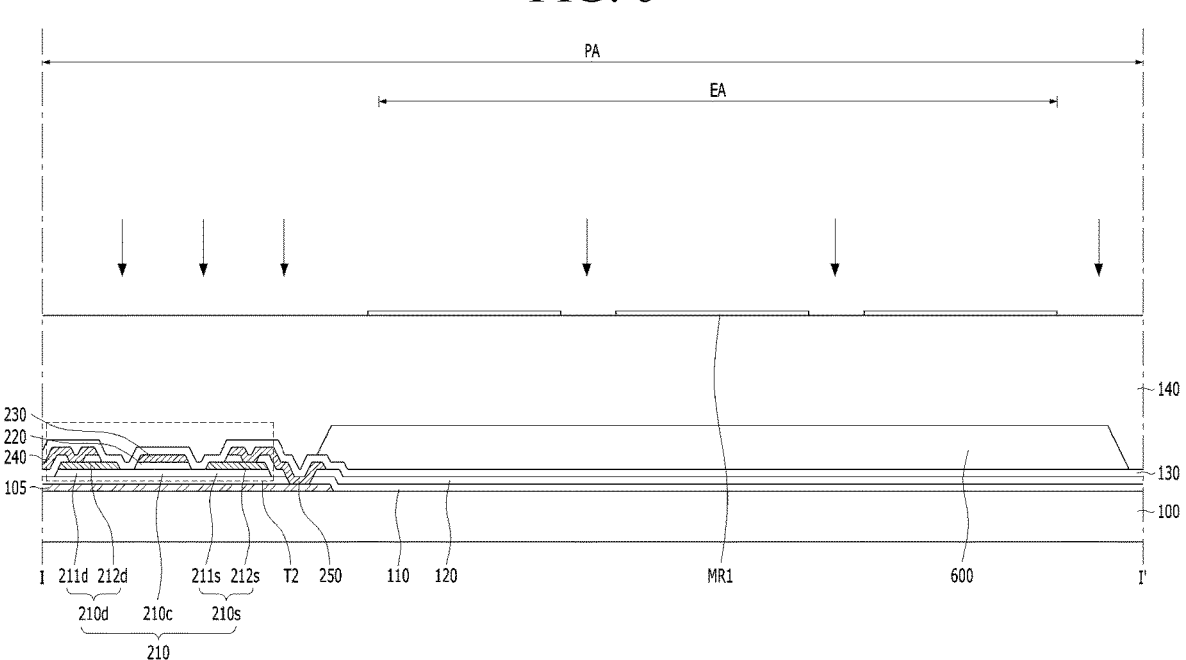
FIGS. 6 to 11 are views sequentially showing a method of forming the display apparatus according to an embodiment of the present disclosure.

The method of forming the display apparatus according to the embodiment of the present disclosure will be described with reference to FIGS. 4 and 6 to 11. First, the method of forming the display apparatus according to the embodiment of the present disclosure can include a step of forming the light-blocking pattern 105 on each pixel area PA of the device substrate 100, a step of forming the device buffer layer 110 covering the light-blocking pattern 105, a step of forming the pixel driving circuit including the second thin film transistor T2 on the device buffer layer 110, a step of forming the interlayer insulating layer 120 on the device buffer layer 110, a step of forming the device passivation layer 130 covering the pixel driving circuit, a step of forming the color filter 600 on the device passivation layer 130, a step of forming the planarization layer 140 covering the color filter 600, and a step of forming a first mask pattern MR1 on the planarization layer 140, as shown in FIG. 6.

The pixel driving circuit can be formed outside the emission area EA defined in each pixel area PA by a subsequent process. The color filter 600 can be formed to overlap the emission area EA of each pixel area PA. The planarization layer 140 can be formed of a negative material. For example, the first mask pattern MR1 can overlap a region in which the planarization protruding portions 140p are formed by a subsequent process. The planarization protruding portions 140p can be formed in the emission area EA of each pixel area PA. For example, the first mask pattern MR1 can be formed to overlap with the color filter 600 of each pixel area PA.

Figure 7:
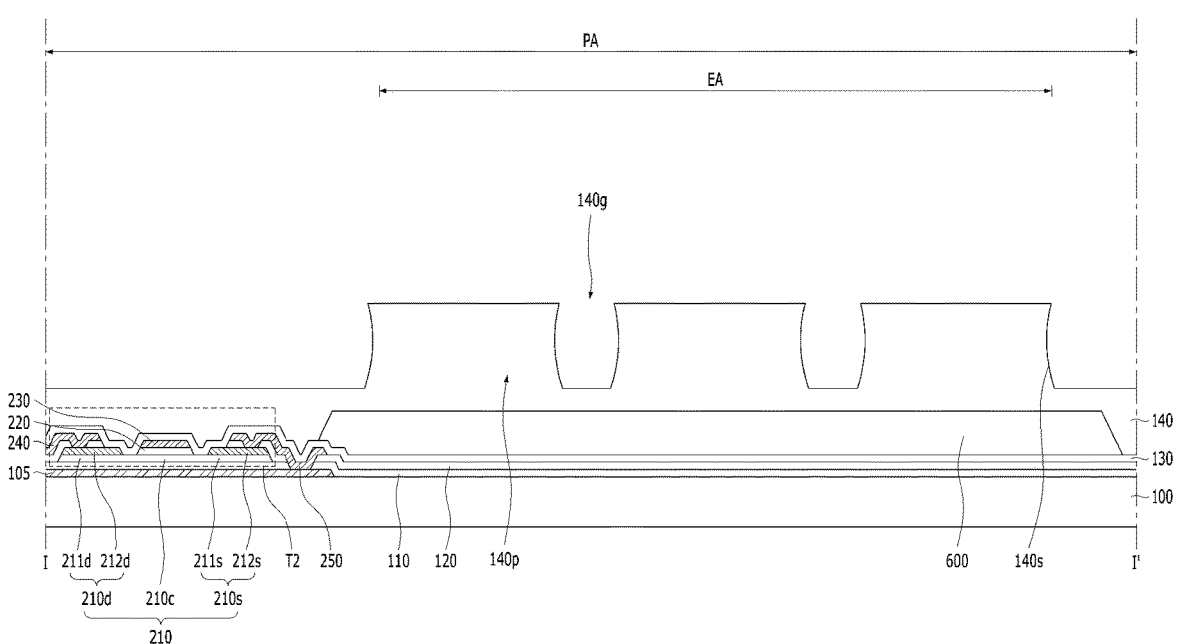

The method of forming the display apparatus according to the embodiment of the present disclosure can include a step of forming the planarization protruding portions 140p in the planarization layer 140 using the first mask pattern MR1, as shown in FIG. 7.

The step of forming the planarization protruding portions 140p can include a step of etching a portion of the planarization layer 140 exposed by the first mask pattern MR1. For example, the planarization groove 140g can be formed outside each planarization protruding portion 140p. The step of forming the planarization protruding portions 140p can include a dry-etch process. Thus, in the method of forming the display apparatus according to the embodiment of the present disclosure, the side surface 140s of each planarization protruding portion 140p can be formed in a concave shape toward the inside of the corresponding planarization protruding portion 140p.

Figure 8:
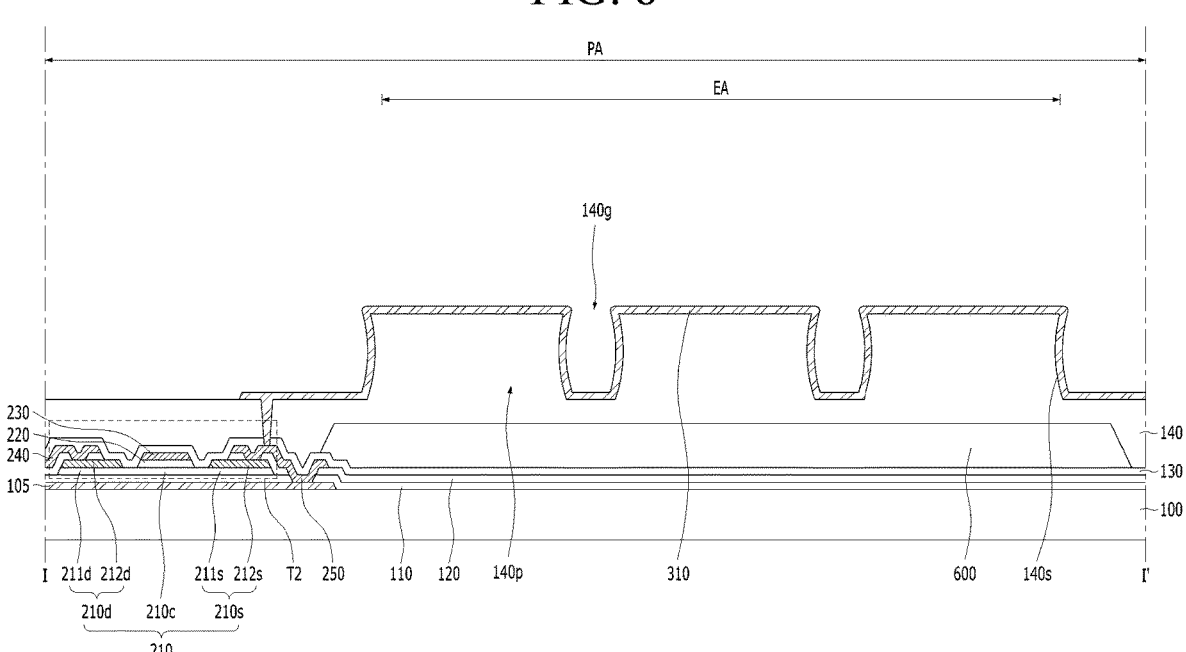

The method of forming the display apparatus according to the embodiment of the present disclosure can include a step of removing the first mask pattern MR1, a step of forming the electrode contact holes partially exposing the pixel driving circuit of each pixel area PA, and a step of forming the first electrode 310 electrically connected to the corresponding pixel driving circuit through one of the electrode contact holes, as shown in FIG. 8.

The first electrode 310 of each pixel area PA can extend along a surface of each planarization protruding portion 140p and the planarization groove 140g on the corresponding pixel area PA. For example, the side surface 140s and the upper surface of each planarization protruding portion 140p and the bottom surface of the planarization groove 140g in each pixel area PA can be covered by the first electrode 310 of the corresponding pixel area PA.

Figure 9:
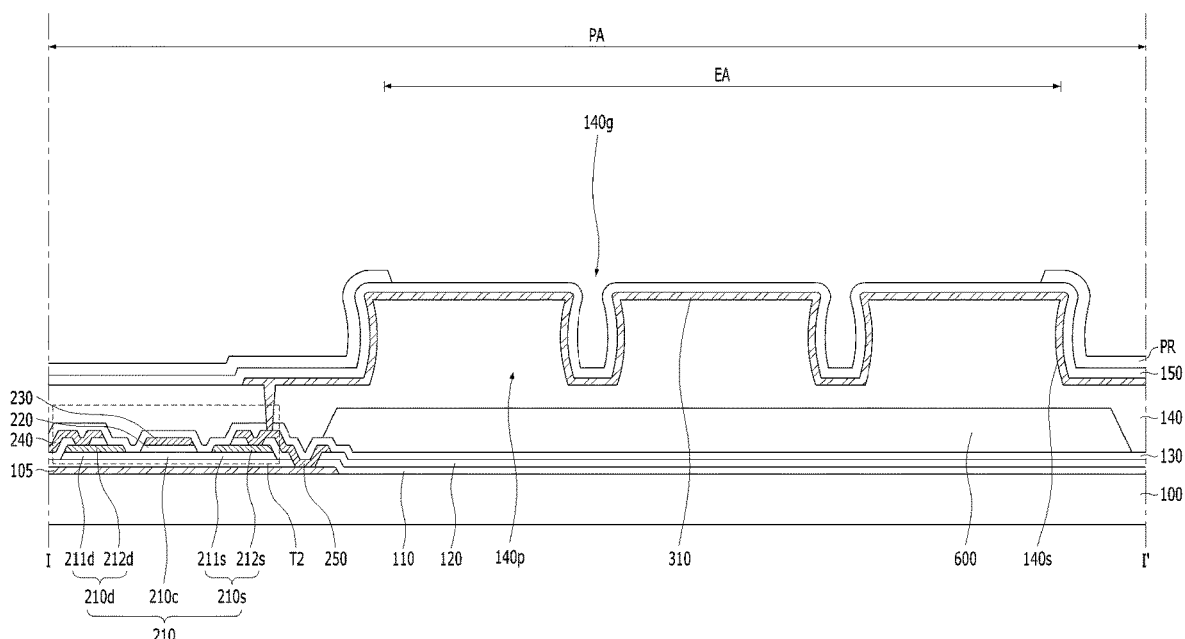

The method of forming the display apparatus according to the embodiment of the present disclosure can include a step of forming the bank insulating layer 150 covering the first electrode 310 of each pixel area PA, and a step of forming a photo-resist pattern PR having an opening overlapping with the emission area EA of each pixel area PA on the bank insulating layer 150, as shown in FIG. 9.

The bank insulating layer 150 can be formed of an inorganic insulating material, such as silicon oxide (SiOx) and silicon nitride (SiNx). The bank insulating layer 150 can be formed as a linear layer. For example, the bank insulating layer 150 on each pixel area PA can have a uniform thickness. The bank insulating layer 150 can extend parallel to the first electrode 310 of each pixel area PA along the surface of each planarization protruding portion 140p and the planarization groove 140g on the corresponding pixel area PA.

Figure 10:
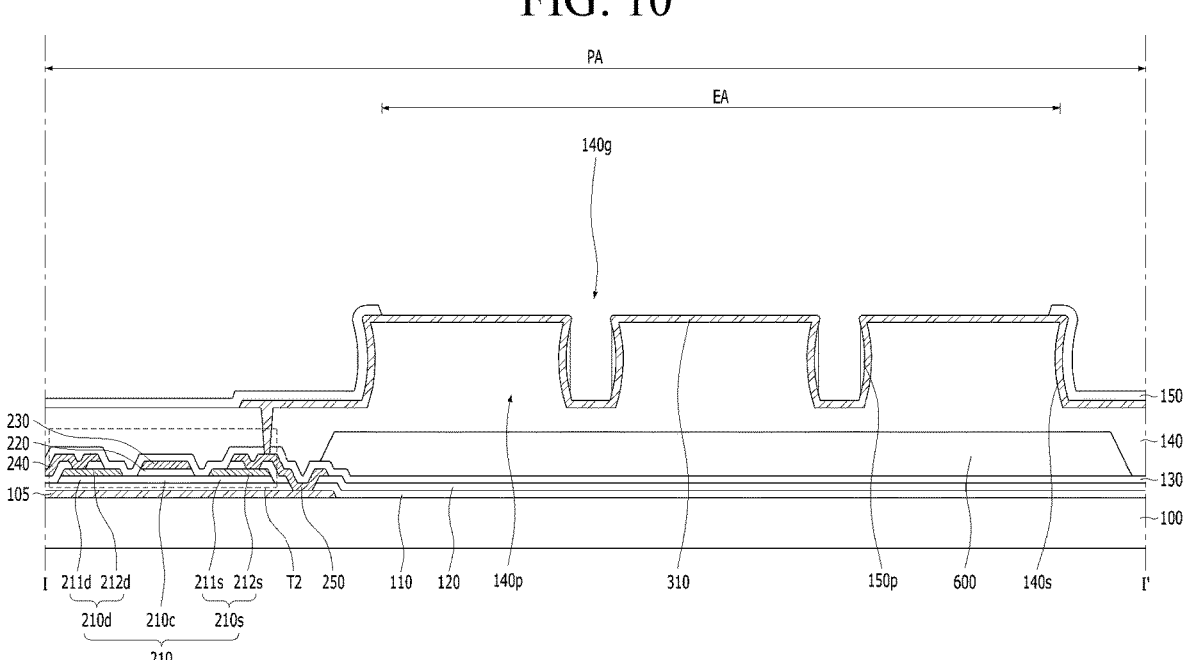

The method of forming the display apparatus according to the embodiment of the present disclosure can include a step of patterning the bank insulating layer 150 using the photo-resist pattern PR, as shown in FIG. 10.

The step of patterning the bank insulating layer 150 can include a step of removing a portion of the bank insulating layer 150 overlapping with the emission area EA of each pixel area PA. For example, a portion of the bank insulating layer 150 disposed on the upper surface of each planarization protruding portion 140p and the bottom surface of the planarization groove 140g in each pixel area PA can be removed by a process of patterning using the photo-resist pattern PR.

The step of patterning the bank insulating layer 150 can include a dry-etch process. Thus, in method of forming the display apparatus according to the embodiment of the present disclosure, a portion of the bank insulating layer 150 covering the side surface 140s of each planarization protruding portion 140p having a concave shape is not removed by the patterning process using the photo-resist pattern PR. For example, the insulating pattern 150p can be formed on the side surface 140s of each planarization protruding portion 140p having a concave shape by the patterning process using the photo-resist pattern PR. The insulating pattern 150p formed on the side surface 140s of each planarization protruding portion 140p having a concave shape can have a thickness smaller than the bank insulating layer 150 disposed outside the emission area EA defined in each pixel area PA. In this way, the amount of light emitted in a direction perpendicular to a viewer can be minimized or prevented by the portion of the bank insulating layer 150 that remains on the side surface 140s of each planarization protruding portion 140p. Also, the concave shape of the side surface 140s can allow for a proper amount of space to hold a corresponding portion of the bank insulating layer 150.

Figure 11:
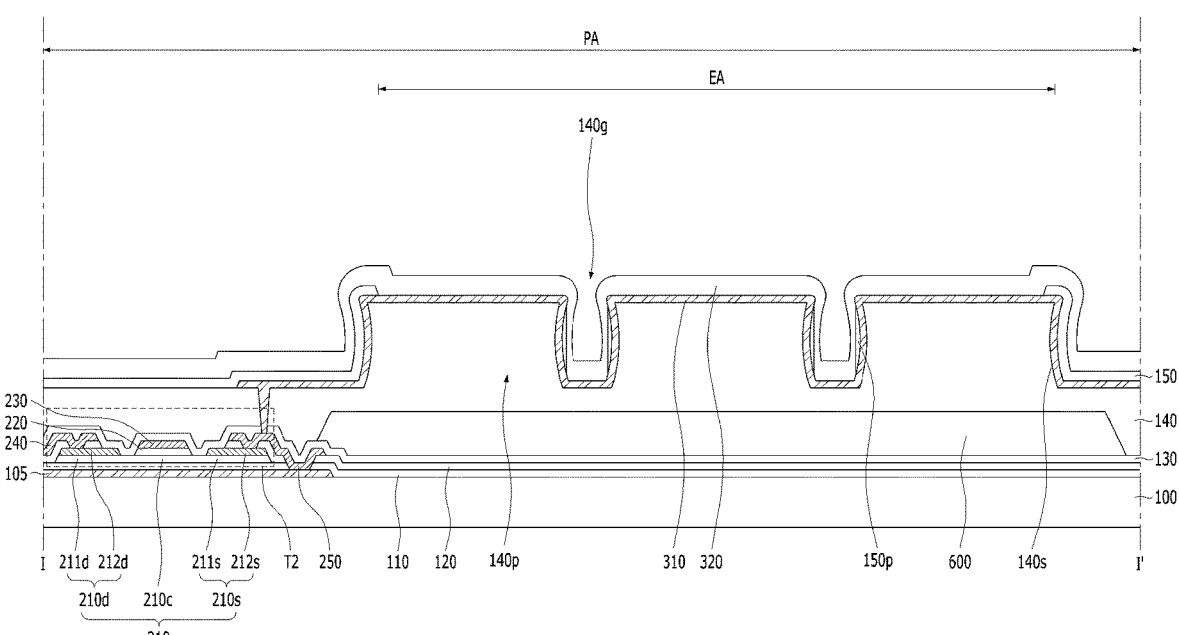

The method of forming the display apparatus according to the embodiment of the present disclosure can include a step of forming the light-emitting layer 320 on each pixel area PA of the device substrate 100 in which the insulating pattern 150p is formed, as shown in FIG. 11, in which the light-emitting layer 320 can extend into each of the grooves 140g.

The step of forming the light-emitting layer 320 can include a deposition process. Thus, in the method of forming the display apparatus according to the embodiment of the present disclosure, a portion of the light-emitting layer 320 formed on the side surface 140s of each planarization protruding portion 140p can have a thickness smaller than other portions of the light-emitting layer 320. For example, a portion of the light-emitting layer 320 formed on the insulating pattern 150p can have a thickness smaller than a portion of the light-emitting layer 320 formed on the bank insulating layer 150. The portion of the light-emitting layer 320 formed on the side surface 140s of each planarization protruding portion 140p can be spaced apart from the corresponding first electrode 310 by the insulating pattern 150p. That is, in the method of forming the display apparatus according to the embodiment of the present disclosure, the portion of the light-emitting layer 320 formed to have a relatively small thickness can be insulated from the corresponding first electrode 310 by the insulating pattern 150p.

The method of forming the display apparatus according to the embodiment of the present disclosure can include a step of forming the second electrode 330 on the light-emitting layer 320 of each pixel area PA, and a step of attaching the encapsulation substrate 500 to the device substrate 100 in which the second electrode 330 is formed using the encapsulating unit 400, as shown in FIG. 4.

The second electrode 330 formed on each pixel area PA can extend along the light-emitting layer 320 of the corresponding pixel area PA. For example, the second electrode 330 of each pixel area PA can extend along the upper surface and the side surface 140s of each planarization protruding portion 140p on the corresponding pixel area PA. The light-emitting layer 320 can be disposed between the insulating pattern 150p and the second electrode 330 on the side surface 140s of each planarization protruding portion 140p. Thus, in the method of forming the display apparatus according to the embodiment of the present disclosure, an electric field is not concentrated in the portion of the light-emitting layer 320 on the side surface 140s of each planarization protruding portion 140p. Therefore, in the method of forming the display apparatus according to the embodiment of the present disclosure, the portion of the light-emitting layer 320 disposed on the side surface 140s of each planarization protruding portion 140p may not emit light. That is, in the method of forming the display apparatus according to the embodiment of the present disclosure, the light can emitted from only a portion of the light-emitting layer 320 disposed on the upper surface of each planarization protruding portion 140p and the bottom surface of the planarization groove 140g, which can direct more light towards the viewer and improve luminance and viewing angle.

Accordingly, in the display apparatus according to the embodiment of the present disclosure, the planarization layer 140 of each pixel area PA can include the planarization protruding portions 140p overlapping with the emission area EA of the corresponding pixel area PA, in which a portion of the first electrode 310 and a portion of the light-emitting layer 320 on the side surface 140s of each planarization protruding portion 140p can be spaced apart from each other by the insulating pattern 150p. Also, each of the planarization protruding portions 140p can have a raised mesa shape with grooves or valleys therebetween. In this way, a total surface area of the light emitting portion can be increased in a small amount of space. In other words, more light can be output while using a smaller footprint, which can allow more pixels to be spaced closer together in a smaller amount of space which can provide for higher resolutions without impairing the brightness. Thus, in the display apparatus according to the embodiment of the present disclosure, a decrease in an emission area due to the portion of the light-emitting layer 320 formed to have a relative small thickness on the side surface 140s of each planarization protruding portion 140p can be prevented, and the light totally reflected between the first electrode 310 and the second electrode 330 of each light-emitting device 300 can be emitted outside by a curve formed by each planarization protruding portion 140p. Therefore, in the display apparatus according to the embodiment of the present disclosure, light-extraction efficiency can be improved, without a decrease in luminous efficiency.

And, in the display apparatus according to the embodiment of the present disclosure, the light generated by the light-emitting device 300 of each pixel area PA can be emitted at various angles by the second electrode 330 of the corresponding pixel area PA covering the planarization protruding portions 140p. Therefore, in the display apparatus according to the embodiment of the present disclosure, a decrease in luminance due to an increase in a viewing angle can be mitigated.

Further, in the display apparatus according to the embodiment of the present disclosure, the side surface 140s of each planarization protruding portion 140p can have a concave shape toward the inside of the corresponding planarization protruding portion 140p. Thus, in the display apparatus according to the embodiment of the present disclosure, the insulating pattern 150p disposed on the side surface 140s of each planarization protruding portion 140p can be formed by a process of forming the bank insulating layer 150 covering an edge of the first electrode 310 on each pixel area PA. Therefore, in the display apparatus according to the embodiment of the present disclosure, the light-extraction efficiency can be effectively improved, without a decrease in process efficiency.

The display apparatus according to the embodiment of the present disclosure is described that the pixel driving circuit DC of each pixel area PA is composed of the first thin film transistor T1, the second thin film transistor T2, the third thin film transistor T3 and the storage capacitor Cst. However, in the display apparatus according to another embodiment of the present disclosure, the pixel driving circuit DC of each pixel area PA can include at least one thin film transistor. For example, in the display apparatus according to another embodiment of the present disclosure, the pixel driving circuit DC of each pixel area PA can include only the first thin film transistor T1, the second thin film transistor T2 and the storage capacitor Cst. And, in the display apparatus according to another embodiment of the present disclosure, the pixel driving circuit DC of each pixel area PA can include at least four thin film transistors. Thus, in the display apparatus according to another embodiment of the present disclosure, the degree of freedom for configuration of the pixel driving circuit DC in each pixel area PA can be improved.

In the display apparatus according to the embodiment of the present disclosure, the position and the electrical connection of the second drain electrodes 240 and the second source electrodes 250 in each pixel area PA can vary depending on the configuration of the pixel driving circuit DC in the corresponding pixel area PA and/or the type of the corresponding thin film transistors T1, T2, and T3. For example, in the display apparatus according to another embodiment of the present disclosure, the second gate electrode 230 of the second thin film transistor T2 in each pixel area PA can be electrically connected to the first drain electrode of the first thin film transistor T1 in the corresponding pixel area PA, and the first electrode 310 of each pixel area PA can be electrically connected to the second drain electrode 240 of the corresponding pixel area PA. Thus, in the display apparatus according to another embodiment of the present disclosure, the degree of freedom for the configuration of the pixel driving circuit DC in each pixel area PA and the type of the thin film transistors T1, T2, and T3 included in each pixel driving circuit DC can be improved.

Figure 12A:
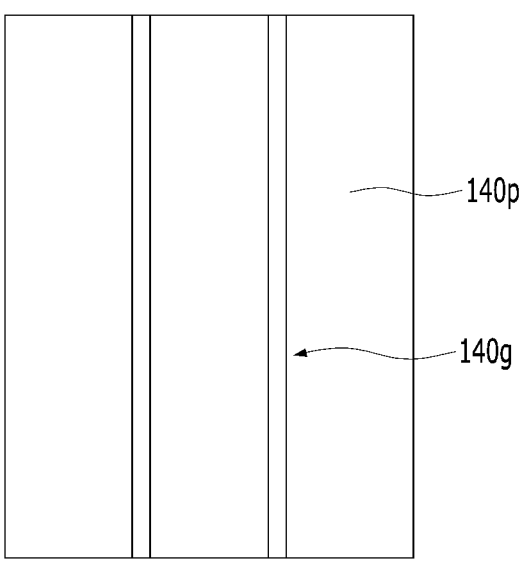
FIGS. 12A to 12E are views showing a plane of an emission area in the display apparatus according to embodiments of the present disclosure, respectively.

The display apparatus according to the embodiment of the present disclosure is described that a plane shape of each planarization protruding portion 140p is a hexagonal shape. However, in the display apparatus according to another embodiment of the present disclosure, each of the planarization protruding portions 140p can have various shapes. For example, in the display apparatus according to another embodiment of the present disclosure, a plane shape of each planarization protruding portion 140p in each emission area EA can be a bar shape extending in a direction, and the planarization groove 140g of each emission area EA can have a shape extending parallel to the corresponding planarization protruding portions 140p, as shown in FIG. 12A. Thus, in the display apparatus according to another embodiment of the present disclosure, a process of forming the planarization protruding portions 140p and the planarization groove 140g in the emission area EA of each pixel area PA can be simplified. Therefore, in the display apparatus according to another embodiment of the present disclosure, process efficiency and light-extraction efficiency can be improved, and a decrease in luminance due to an increase in a viewing angle can be reduced.

Figure 12B:
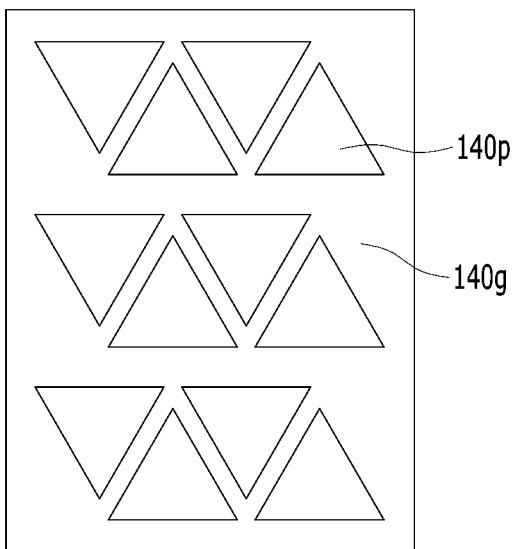
Figure 12C:
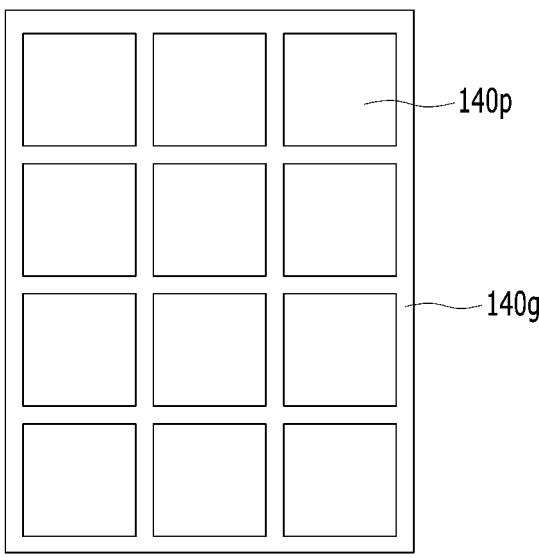

In the display apparatus according to another embodiment of the present disclosure, a plane shape of each planarization protruding portion 140p can be a polygonal shape. For example, in the display apparatus according to another embodiment of the present disclosure, a plane shape of each planarization protruding portion 140p can be a triangle shape, as shown in FIG. 12B. And, in the display apparatus according to another embodiment of the present disclosure, a plane shape of each planarization protruding portion 140p can be a square shape, as shown in FIG. 12C. Thus, in the display apparatus according to another embodiment of the present disclosure, the degree of freedom for a plane shape of each planarization protruding portion 140p can be improved. Also, a plane shape of each planarization protruding portion 140p can be a polygonal shape with rounded corners.

Figure 12D:
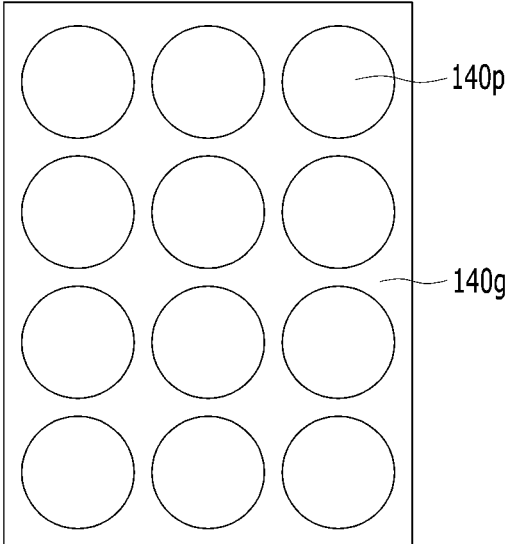

In the display apparatus according to another embodiment of the present disclosure, a plane shape of each planarization protruding portion 140p can be a circle shape, as shown in FIG. 12D. Thus, in the display apparatus according to another embodiment of the present disclosure, the light reflected by the second electrode covering each planarization protruding portion 140p can have uniform luminance, regardless of the azimuth angle. Therefore, in the display apparatus according to another embodiment of the present invention, luminance deviation according to the azimuth angle and the viewing angle can be prevented.

Figure 12E:
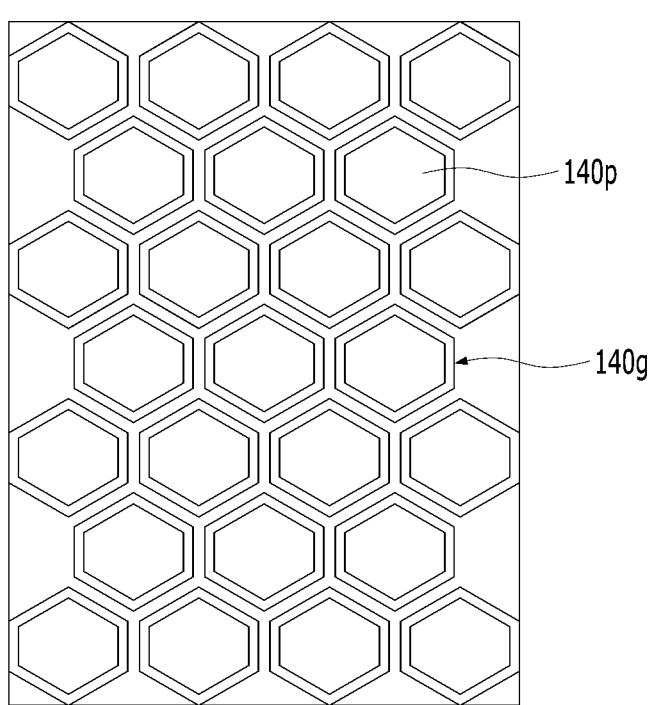

The display apparatus according to the embodiment of the present disclosure is described that the planarization groove 140g is disposed only between the planarization protruding portions 140p. However, in the display apparatus according to another embodiment of the present disclosure, the planarization groove 140g can extend along an edge of each planarization protruding portion 140p (e.g., the groove can extend along the entire perimeter of each raised mesa shape), as shown in FIG. 12E. For example, in the display apparatus according to another embodiment of the present disclosure, a plane shape of each planarization protruding portion 140p can be defined by the planarization groove 140g. Thus, in the display apparatus according to another embodiment of the present disclosure, the degree of freedom for a relative position of each planarization protruding portion 140p and the planarization groove 140g can be improved.

The display device according to the embodiment of the present disclosure is described that a plurality of the planarization protruding portions 140*p* are disposed in the emission area EA of each pixel area PA. However, in the display apparatus according to another embodiment of the present disclosure, a single planarization protruding portion 140*p* and the planarization groove 140*g* surrounding the planarization protruding portion 140*p* can be disposed in the emission area EA of each pixel area PA. Thus, in the display apparatus according to another embodiment of the present disclosure, the degree of freedom for the number of the planarization protruding portions 140*p* and the number of the planarization grooves 140*g* in the emission area EA of each pixel area PA can be improved.

Figures 13, 14:
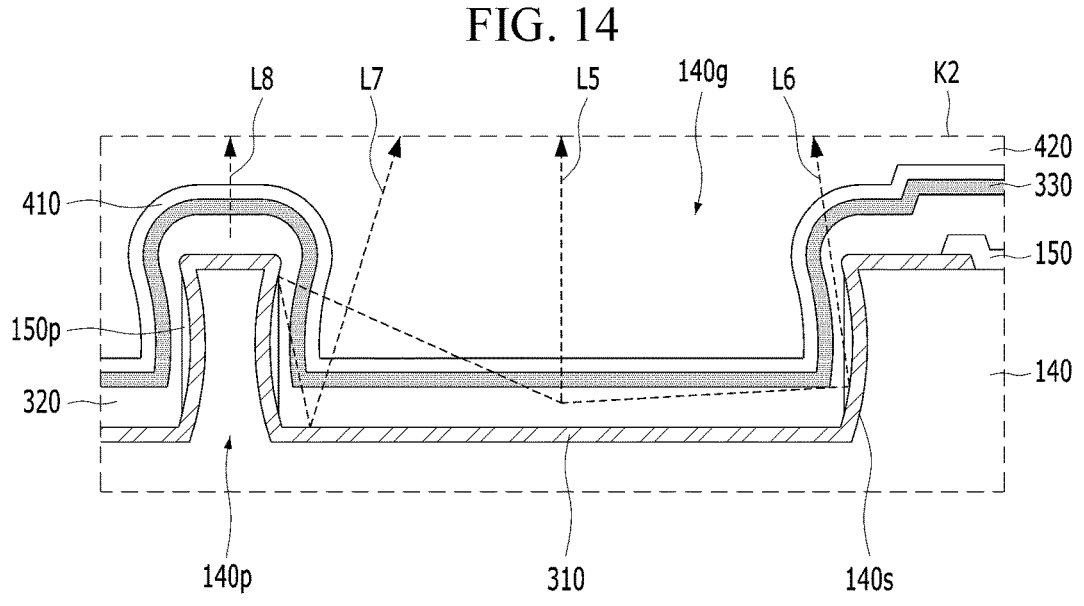
FIG. 13 is a view showing a cross-section of a pixel area in the display apparatus according to another embodiment of the present disclosure.
FIG. 14 is an enlarged view of K2 region in FIG. 13 according to an embodiment of the present disclosure.

The display device according to the embodiment of the present disclosure is described that each of the planarization protruding portions 140*p* has a size larger than the planarization groove 140*g* between the planarization protruding portions 140*p*. However, in the display apparatus according to another embodiment of the present disclosure, a portion of the planarization layer 140 overlapping with the emission area EA of each pixel area PA can include a plurality of the planarization grooves 140*g* and a planarization protruding portion 140*p* between the planarization grooves 140*g*, in which the planarization protruding portion 140*p* can have a width smaller than each planarization groove 140*g*, as shown in FIG. 13 (e.g., the grooves can be larger or wider than the raised mesa shaped portions). Thus, in the display apparatus according to another embodiment of the present disclosure, the degree of freedom for a relative size of the planarization protruding portion 140*p* and the planarization groove 140*g* in the emission area EA of each pixel area PA can be improved.

In the display apparatus according to another embodiment of the present disclosure, the light generated from the light-emitting layer 320 of each light-emitting device 300 can be emitted outside through the second electrode 330 of the corresponding light-emitting device 300. For example, in the display apparatus according to another embodiment of the present disclosure, the first electrode 310 of each light-emitting device 300 can include a metal, such as aluminum (Al) and silver (Ag). The first electrode 310 can have a multi-layer structure. For example, the first electrode 310 can have a structure in which a reflective electrode made of a metal is disposed between transparent electrodes made of a transparent conductive material, such as ITO and IZO. The second electrode 330 of each light-emitting device 300 can have a transmissivity higher than the first electrode 310 of the corresponding light-emitting device 300. For example, the second electrode 330 of each light-emitting device 300 can be a transparent electrode made of a transparent conductive material, such as ITO and IZO, or a translucent electrode in which metals such as Ag and Mg are thinly formed. Thus, in the display apparatus according to another embodiment of the present disclosure, a portion of the light-emitting layer 320 disposed on the bottom surface of each planarization groove 140*g* can generate light L5 emitted in a direction perpendicular to an upper surface of the device substrate 100 and light L6 and L7 emitted obliquely on the upper surface of the device substrate 100. The light L6 and L7 emitted obliquely on the upper surface of the device substrate 100 from the portion of the light-emitting layer 320 on the bottom surface of each planarization groove 140*g* can be reflected outside by the first electrode 310 covering the side surface 140*s* of the corresponding planarization groove 140*g*. The light L6 and L7 reflected by the first electrode 310 covering the side surface 140*s* of the corresponding planarization groove 140*g* can be reflected at various angles depending on the incident position. Therefore, in the display apparatus according to another embodiment of the present disclosure, the light-extraction efficiency can be improved, a decrease in luminance due to an increase in a viewing angle can be mitigated. The light L8 generated on a portion of the light-emitting layer 320 disposed on the upper surface of the planarization protruding portion 140*p* can be emitted outside without reflection by the first electrode 310.

FIGS. 15 to 19 are views sequentially showing a method of forming the display apparatus according to another embodiment of the present disclosure.

The method of forming the display apparatus according to another embodiment of the present disclosure will be described with reference to FIGS. 13 and 15 to 19. First, the method of forming the display apparatus according to another embodiment of the present disclosure can include a step of forming the device passivation layer 130 and the planarization layer 140 on the device substrate 100 in which the pixel driving circuit of each pixel area PA is formed, and a step of forming a plurality of the planarization grooves 140*g* in a portion of the planarization layer 140 overlapping with the emission area EA of each pixel area PA using a second mask pattern MR2, as shown in FIG. 15.

The step of forming the plurality of the planarization grooves 140*g* can include a step of etching a portion of the planarization layer 140 exposed by the second mask pattern MR2. For example, the planarization protruding portion 140*p* can be formed between the planarization grooves 140*g*. The step of forming the plurality of the planarization grooves 140*g* can include a dry-etch process. Thus, in the method of forming the display apparatus according to another embodiment of the present disclosure, a side surface 140*s* of each planarization groove 140*g* can be formed to have a convex shape toward outside of the corresponding planarization groove 140*g*.

Figures 15, 16:
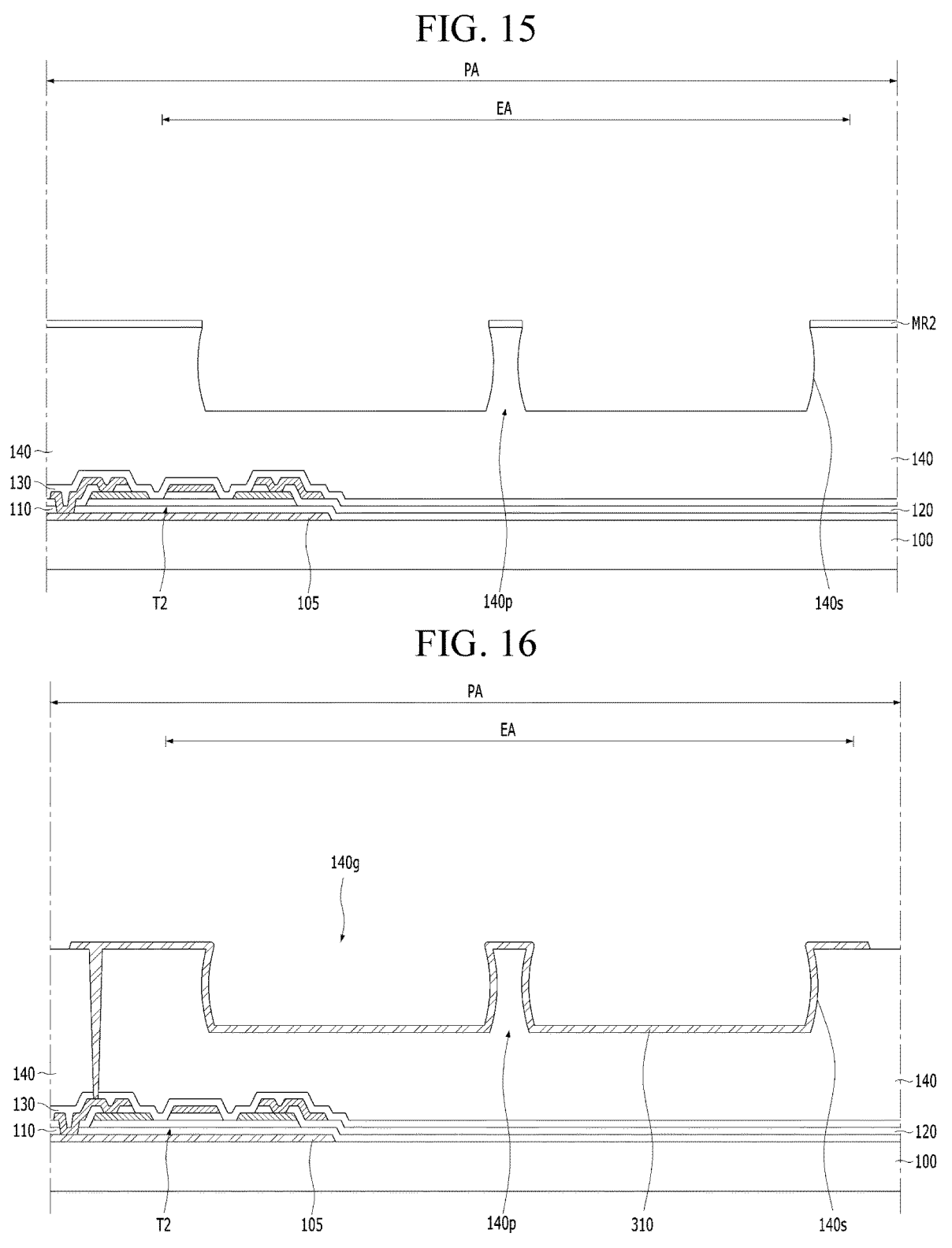

The method of forming the display apparatus according to another embodiment of the present disclosure can include a step of removing the second mask pattern MR2, a step of forming the electrode contact holes partially exposing the pixel driving circuit of each pixel area PA in the planarization layer 140, and a step of forming the first electrode 310 electrically connected to the corresponding pixel driving circuit through one of the electrode contact holes, as shown in FIG. 16.

The first electrode 310 of each pixel area PA can extend along a surface of each planarization groove 140*g* and the planarization protruding portion 140*p* on the corresponding pixel area PA. For example, the side surface 140*s* and the bottom surface of each planarization groove 140*g* and the upper surface of the planarization protruding portion 140*p* on each pixel area PA can be covered by the first electrode 310 of the corresponding pixel area PA.

Figure 17:
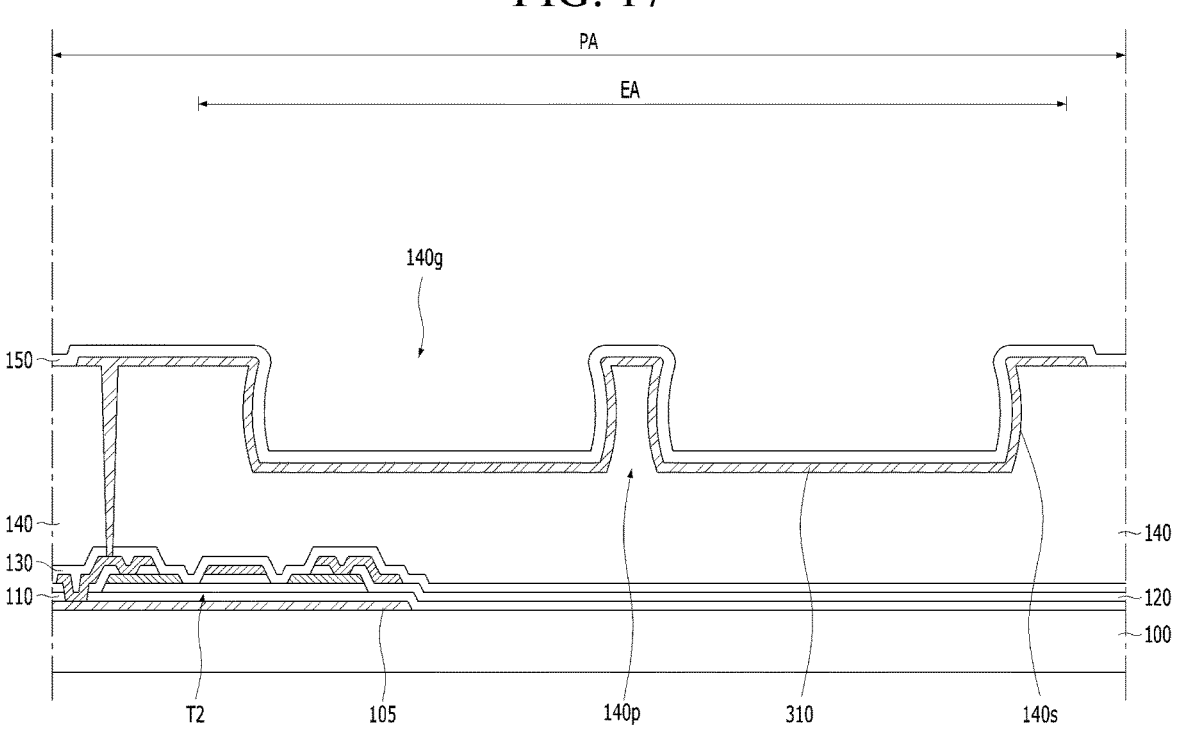

The method of forming the display apparatus according to another embodiment of the present disclosure can include a step of forming the bank insulating layer 150 covering the first electrode 310 of each pixel area PA, as shown in FIG. 17.

The bank insulating layer 150 can be formed of an inorganic insulating material, such as silicon oxide (SiOx) and silicon nitride (SiNx). The bank insulating layer 150 can be formed as a linear layer. For example, the bank insulating layer 150 on each pixel area PA can have a uniform thickness. The bank insulating layer 150 can extend parallel to the first electrode 310 of each pixel area PA along the surface of each planarization groove 140*g* and the planarization protruding portion 140*p* on the corresponding pixel area PA.

Figure 18:
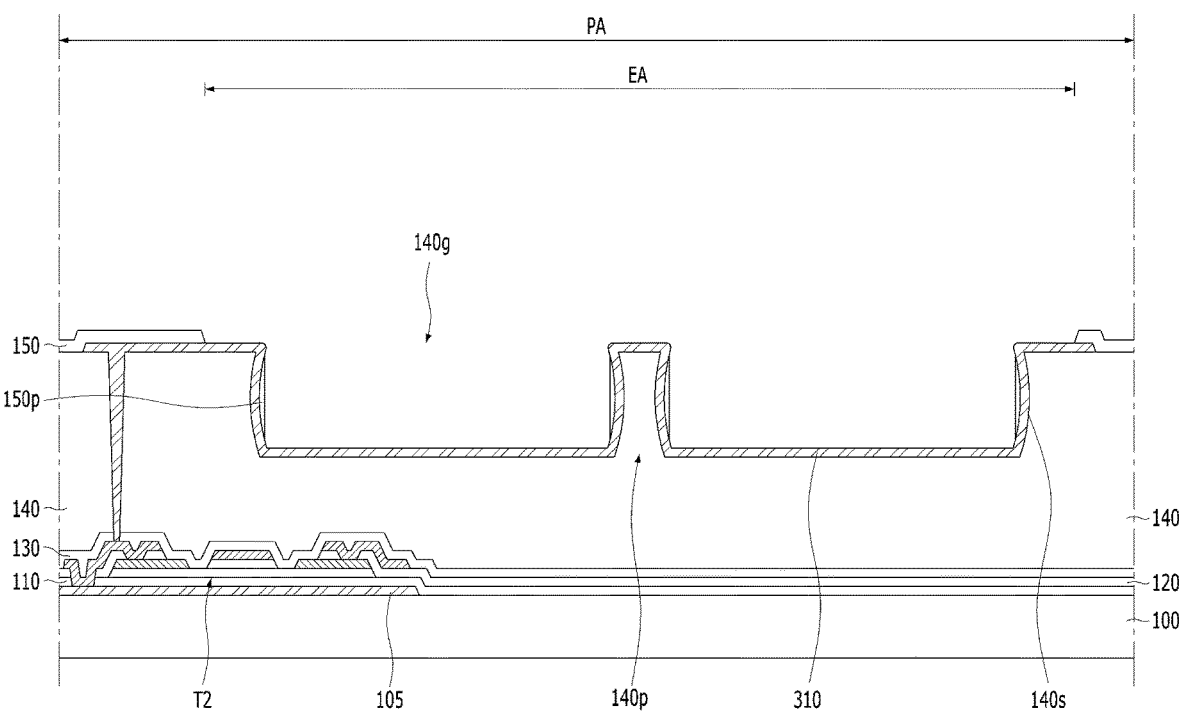

The method of forming the display apparatus according to another embodiment of the present disclosure can include a step of partially exposing the first electrode 310 of each pixel area PA by patterning the bank insulating layer 150, as shown in FIG. 18.

A portion of the first electrode 310 exposed by the bank insulating layer 150 in each pixel area PA can overlap with the emission area EA of the corresponding pixel area PA. For example, the step of patterning the bank insulating layer 150 can include a step of defining the emission area EA in each pixel area PA. The step of patterning bank insulating layer 150 can include a dry-etch process. Thus, in the method of forming the display apparatus according to another embodiment of the present disclosure, a portion of the bank insulating layer 150 covering the side surface 140s of each planarization groove 140g having a convex shape is not completely removed. For example, the insulating pattern 150p can be formed on the side surface 140s of each planarization groove 140g having a convex shape. The insulating pattern 150p formed on the side surface 140s of each planarization groove 140g having a convex shape can have a thickness smaller than the bank insulating layer 150 defining the emission area EA of each pixel area PA.

Figure 19:
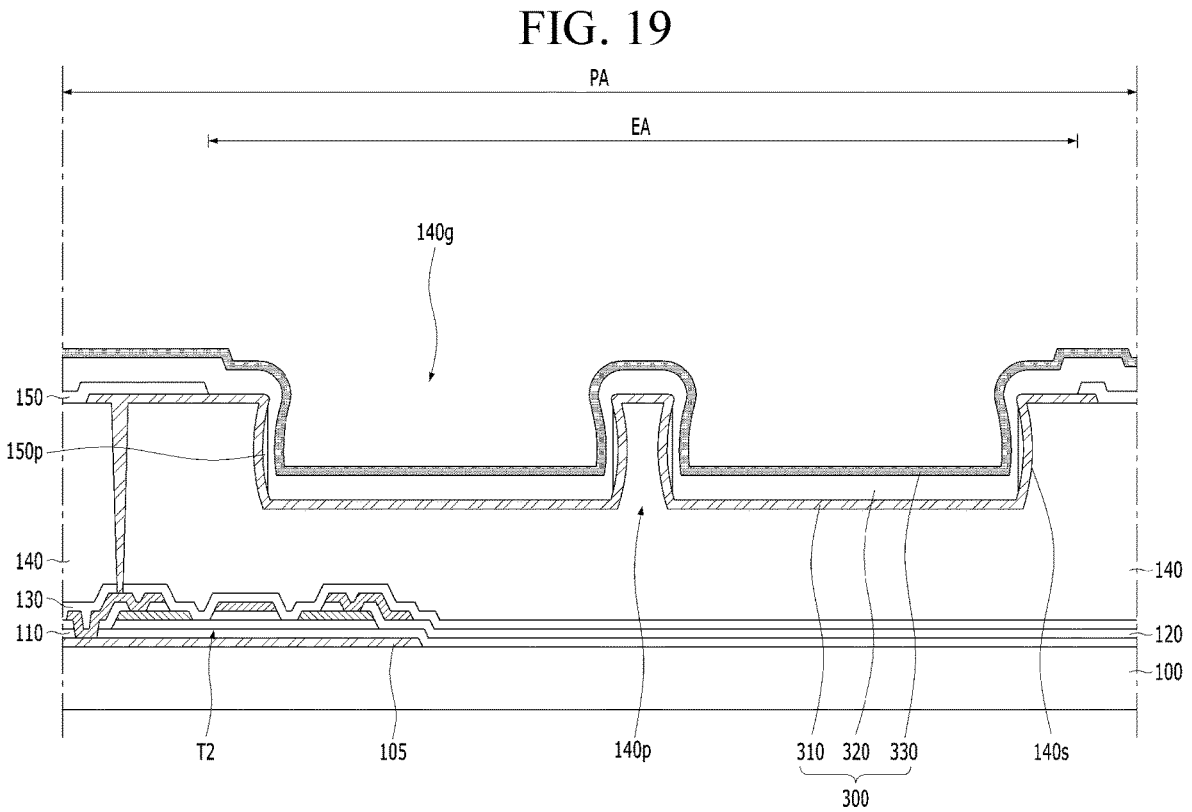

The method of forming the display apparatus according to another embodiment of the present disclosure can include a step of forming the light-emitting layer 320 on each pixel area PA of the device substrate 100 in which the insulating pattern 150p is formed, and a step of forming the second electrode 330 on the light-emitting layer 320 of each pixel area PA, as shown in FIG. 19.

The step of forming the light-emitting layer 320 can include a deposition process. For example, a portion of the light-emitting layer 320 formed on the side surface 140s of each planarization groove 140g can have a relatively small thickness. The second electrode 330 formed on each pixel area PA can extend along the light-emitting layer 320 of the corresponding pixel area PA. For example, a portion of the first electrode 310, the insulating pattern 150p, a portion of the light-emitting layer 320 and a portion of the second electrode 330 can be sequentially stacked on the side surface 140s of each planarization groove 140g. That is, in the method of forming the display apparatus according to another embodiment of the present disclosure, a portion of the light-emitting layer 320 formed on the side surface 140s of each planarization groove 140g can be insulated from the corresponding first electrode 310 by the insulating pattern 150p. Therefore, in the method of forming the display apparatus according to another embodiment of the present disclosure, light is not emitted from a portion of the light-emitting layer 320 on the side surface 140s of each planarization groove 140g or the amount of light emitting from a portion of the light-emitting layer 320 on the side surface 140s of each planarization groove 140g can be minimized or adjusted.

The method of forming the display apparatus according to another embodiment of the present disclosure can include a step of forming the encapsulating unit 400 on the second electrode 330 of each pixel area PA, as shown in FIG. 13.

The encapsulating unit 400 can be formed in a multi-layer structure. For example, the encapsulating unit 400 can include a first encapsulating layer 410, a second encapsulating layer 420 and a third encapsulating layer 430, which are sequentially stacked on the second electrode 330 of each pixel area PA. The first encapsulating layer 410, the second encapsulating layer 420 and the third encapsulating layer 430 can include an insulating material. The second encapsulating layer 420 can include a material different from the first encapsulating layer 410 and the third encapsulating layer 430. The encapsulating unit 400 can be formed in a stacked structure of an inorganic insulating layer and an organic insulating layer. For example, the first encapsulating layer 410 and the third encapsulating layer 430 can be an inorganic insulating layer made of silicon oxide (SiOx) or silicon nitride (SiNx), and the second encapsulating layer 420 can be an organic insulating layer made of an organic insulating material. Thus, in the method of forming the display apparatus according to another embodiment of the present disclosure, the damages of the light-emitting devices 300 due to the external moisture and impact can be effectively prevented, and the light-extraction efficiency can be improved. And, in the method of forming the display apparatus according to another embodiment of the present disclosure, a decrease in luminance due to an increase in a viewing angle can be effectively reduced, without a decrease in the process efficiency and the luminous efficiency.

Figure 20:
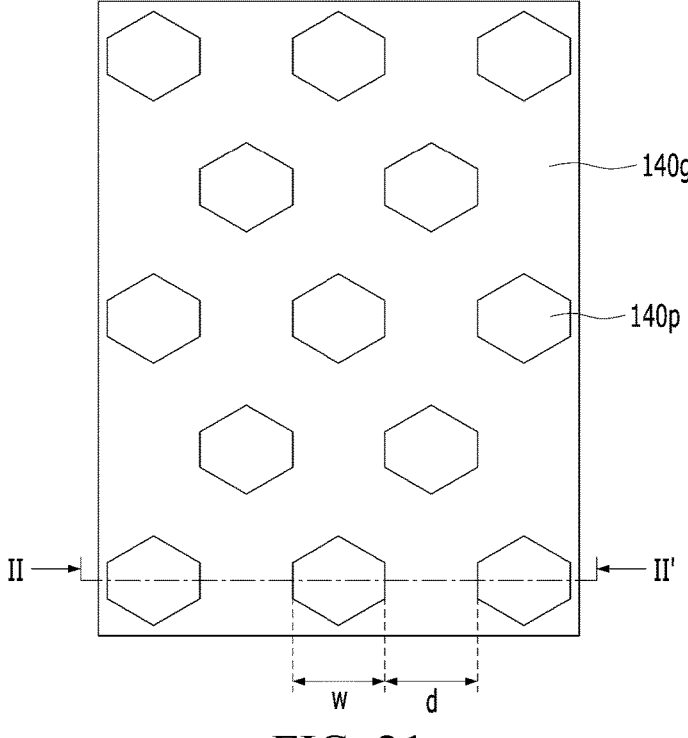
FIGS. 20 and 21 are views showing the display apparatus according to another embodiment of the present disclosure.
Figure 21:
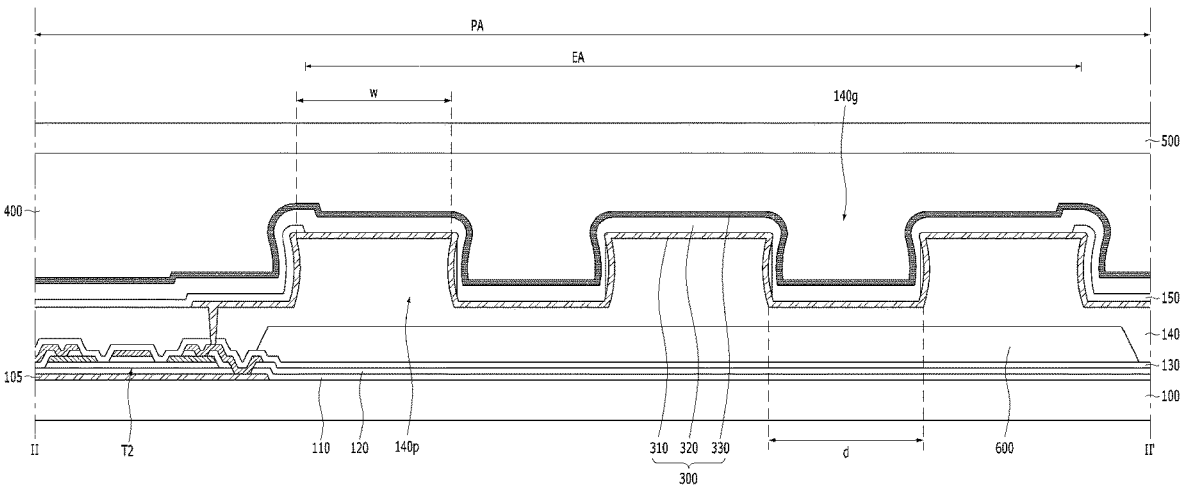

The display apparatus according to the embodiment of the present disclosure is described that a width of the planarization groove 140g between adjacent planarization protruding portions 140p is smaller than a width of each planarization protruding portion 140p. However, in the display apparatus according to another embodiment of the present disclosure, a distance d between adjacent planarization protruding portions 140p can be a same as a width of each planarization protruding portion 140p, as shown in FIGS. 20 and 21. That is, in the display apparatus according to another embodiment of the present disclosure, the planarization groove 140g can have a same width as each planarization protruding portion 140p. Thus, in the display apparatus according to another embodiment of the present disclosure, the light-extraction efficiency can be effectively improved, without a decrease in luminous efficiency. Therefore, in the display apparatus according to another embodiment of the present disclosure, power required for the operation of each pixel area PA can be effectively reduced. And, in the display apparatus according to another embodiment of the present disclosure, a decrease in luminance due to an increase in a viewing angle can be effectively mitigated or prevented.

As a result, the display apparatus according to the embodiments of the present disclosure can include the planarization layer having the planarization groove or the planarization protruding portion, and the light-emitting device on the planarization layer, in which the first electrode, the light-emitting layer and the second electrode of the light-emitting device can extend on the side surface of the planarization groove or the side surface of the planarization protruding portion, and the first electrode and the light-emitting layer can be spaced apart from each other on the side surface of the planarization groove or the side surface of the planarization protruding portion by the insulating pattern. Thus, in the display apparatus according to the embodiments of the present disclosure, the light-extraction efficiency can be improved, without a decrease in luminous efficiency. Thereby, in the display apparatus according to the embodiments of the present disclosure, the power required for the operation of each pixel area can be reduced without impairing brightness. That is, in the display apparatus according to the embodiments of the present disclosure, power consumption can be reduced by low power driving. And, in the display apparatus according to the embodiments of the present disclosure, a decrease in luminance due to an increase in a viewing angle can be mitigated or prevented.

What is claimed is:

1. A display apparatus comprising:

a bank insulating layer disposed on a substrate, the bank insulating layer defining an emission area in a pixel area;

a planarization layer disposed between the substrate and the bank insulating layer, the planarization layer including a planarization protruding portion overlapping with the emission area;

an insulating pattern disposed on a side surface of the planarization protruding portion, the insulating pattern being spaced apart from an upper surface of the planarization protruding portion; and a light-emitting device disposed on the planarization layer in the emission area, the light-emitting device having a stacked structure including a first electrode, a light-emitting layer and a second electrode, wherein the side surface of the planarization protruding portion has a concave shape that is depressed toward an inside of the planarization protruding portion, and wherein the insulating pattern is disposed between the first electrode and the light-emitting layer of the light-emitting device.

2. The display apparatus according to claim 1, wherein a plane shape of the planarization protruding portion is a polygonal shape.

3. The display apparatus according to claim 1, wherein the insulating pattern includes a same material as the bank insulating layer.

4. The display apparatus according to claim 3, wherein the bank insulating layer is a linear layer having a uniform thickness, and a thickness of the insulating pattern is smaller than a thickness of the bank insulating layer.

5. The display apparatus according to claim 1, wherein a reflectivity of the second electrode is greater than a reflectivity of the first electrode.

6. The display apparatus according to claim 5, further comprising a color filter disposed between the substrate and the planarization layer, the color filter overlapping with the emission area.

7. The display apparatus according to claim 1, wherein the planarization layer further includes a planarization groove at least partially surrounding the planarization protruding portion.

8. The display apparatus according to claim 7, wherein a width of the planarization groove is smaller than a width of the planarization protruding portion.

9. The display apparatus according to claim 7, wherein a width of the planarization groove is greater than or equal to a width of the planarization protruding portion.

\* \* \* \* \*